(12) United States Patent
Naka et al.

(10) Patent No.: US 11,070,046 B2
(45) Date of Patent: Jul. 20, 2021

(54) SHORT-CIRCUIT PROTECTION CIRCUIT FOR SELF-ARC-EXTINGUISHING TYPE SEMICONDUCTOR ELEMENT

(71) Applicant: Mitsubishi Electric Corporation, Chiyoda-ku (JP)

(72) Inventors: Yoshitaka Naka, Chiyoda-ku (JP); Yasushi Nakayama, Chiyoda-ku (JP); Yoshiko Tamada, Chiyoda-ku (JP); Hiroyuki Takagi, Chiyoda-ku (JP); Junichiro Ishikawa, Chiyoda-ku (JP); Kazuhiro Otsu, Chiyoda-ku (JP); Naohiko Mitomi, Chiyoda-ku (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 651 days.

(21) Appl. No.: 15/505,812

(22) PCT Filed: Sep. 11, 2014

(86) PCT No.: PCT/JP2014/074054
§ 371 (c)(1),
(2) Date: Feb. 22, 2017

(87) PCT Pub. No.: WO2016/038717
PCT Pub. Date: Mar. 17, 2016

(65) Prior Publication Data
US 2017/0288385 A1    Oct. 5, 2017

(51) Int. Cl.
*H02H 3/00* (2006.01)
*H02H 3/08* (2006.01)
(Continued)

(52) U.S. Cl.
CPC .......... *H02H 3/08* (2013.01); *H01L 27/0292* (2013.01); *H01L 29/7393* (2013.01); *H02M 7/5387* (2013.01); *H03K 17/0822* (2013.01)

(58) Field of Classification Search
CPC .... H02H 3/08; H01L 27/0292; H01L 29/7393
(Continued)

(56) References Cited

U.S. PATENT DOCUMENTS 8,537,517 B1 *  9/2013  Banak ................. H02H 11/002
                                            361/93.1
9,344,006 B2 *  5/2016  Kimmer ............... H02M 7/537
(Continued)

FOREIGN PATENT DOCUMENTS

CN    1012769375 A    11/2012
JP    2002-353795 A    12/2002
(Continued)

OTHER PUBLICATIONS

Office Action dated Sep. 11, 2017 in Korean Patent Application No. 10-2017-7006597 (with English language translation).
(Continued)

*Primary Examiner* — Jared Fureman
*Assistant Examiner* — Lucy M Thomas
(74) *Attorney, Agent, or Firm* — Xsensus LLP

(57) ABSTRACT

A short-circuit protection circuit for a self-arc-extinguishing type semiconductor element includes a first protection circuit and a second protection circuit. The first protection circuit is configured to reduce a voltage between a control electrode and a first main electrode of the self-arc-extinguishing type semiconductor element when detecting overcurrent flowing between the first main electrode and a second main electrode. The second protection circuit is configured to: detect current flowing in an interconnection adapted to supply the drive voltage; determine, based on the detected current, whether the first protection circuit is in an operating state; and change the drive voltage to turn off the self-arc-extinguishing type semiconductor element when the first protection circuit is in the operating state.

15 Claims, 15 Drawing Sheets

(51) Int. Cl.
*H02M 7/5387* (2007.01)
*H03K 17/082* (2006.01)
*H01L 27/02* (2006.01)
*H01L 29/739* (2006.01)

(58) Field of Classification Search
USPC .................................................. 361/93.1
See application file for complete search history.

(56) References Cited

U.S. PATENT DOCUMENTS

| | | | |
|---|---|---|---|
| 2002/0176215 A1 | 11/2002 | Hiyama et al. | |
| 2004/0200463 A1* | 10/2004 | Ando | F02P 3/0435 123/630 |
| 2011/0133790 A1* | 6/2011 | Nagata | H03K 17/168 327/109 |
| 2012/0280728 A1 | 11/2012 | Hussein et al. | |
| 2017/0373583 A1* | 12/2017 | Nakajima | H02M 1/08 |

FOREIGN PATENT DOCUMENTS

| | | |
|---|---|---|
| JP | 2005-20643 A | 1/2005 |
| JP | 2008-182826 A | 8/2008 |
| KR | 10-2012-0124031 A | 11/2012 |
| WO | 01/063764 A1 | 8/2001 |

OTHER PUBLICATIONS

"Catalog of Hybrid IC for Driving IGBT Module, M57160AL-01", Published by Isahaya Electronics Corporation, (Feb. 2005), 10 pages (with English Summary).

International Search Report dated Dec. 9, 2014 in PCT/JP2014/074054 Filed Sep. 11, 2014.

Combined Office Action and Search Report dated Jun. 5, 2019 in Chinese Patent Application No. 201480081850.7, 15 pages (with unedited computer generated English translation and English translation of categories of cited documents).

* cited by examiner

SHORT-CIRCUIT PROTECTION CIRCUIT FOR SELF-ARC-EXTINGUISHING TYPE SEMICONDUCTOR ELEMENT

TECHNICAL FIELD

The present invention relates to a short-circuit protection circuit for protecting a self-arc-extinguishing type semiconductor element when short-circuit current flows in the self-arc-extinguishing type semiconductor element.

BACKGROUND ART

In a power electronics system such as elevator, electric railroad, industrial machine, and photovoltaic power generator, generally a power module is used in which a plurality of power semiconductor elements such as diode and self-arc-extinguishing type semiconductor element are included. The power module is generally equipped with a short-circuit protection circuit in order to prevent the self-arc-extinguishing type semiconductor element from being broken when short-circuit current flows in the self-arc-extinguishing type semiconductor element.

For example, Japanese Patent Laying-Open No. 2005-20843 (PTD 1) discloses an IGBT module in which an RTC (Real-Time Current Control) circuit is included. The RTC circuit has a function of limiting short-circuit current by reducing a gate voltage when detecting the short-circuit current flowing in an IGBT (Insulated Gate Bipolar Transistor) device. Further, a drive circuit (gate driver) of five IGBT device is equipped with a short-circuit detection circuit which detects, based on a gate voltage drop, that the RTC circuit is operating.

WO01/063764 (PTD 2) discloses an example of the intelligent power module having a short-circuit protection circuit and a drive circuit which are included in the power module. According to this example of the above-referenced document, when an overcurrent detector which corresponds to the aforementioned RTC circuit detects that sense current of an IGBT exceeds a set value, a junction capacitance between the collector and the gate of the IGBT is charged based on an output signal from the overcurrent detector. After a certain time, the IGBT is turned off.

CITATION LIST

Patent Document

PTD 1: Japanese Patent Laying-Open No. 2005-20843
PTD 1: WO01/063764

SUMMARY OF INVENTION

Technical Problem

For the short-circuit protection circuit, it is desirable to shorten as much as possible the time from detection of the short-circuit current to completion of a protecting operation for the self-arc-extinguishing type semiconductor element. The RTC circuit is therefore included in the power module as disclosed in the above-referenced document. The RTC circuit enables shortening of the time from detection of the short-circuit current to reduction of the current flowing in the self-arc-extinguishing type semiconductor element.

In order to further turn off the self-arc-extinguishing type semiconductor element by a drive voltage from the gate driver after detection of the short-circuit current, it is necessary to inform the gate driver of the fact that the short-circuit current is detected or that the RTC circuit is in an operating state. However, a signal delay at this time may still cause a problem of a delay in time taken for turning off the self-arc-extinguishing type semiconductor element.

In particular, a delay of the protecting operation is apt to be a problem in the case of a configuration where the gate driver and the power module are separately provided, for the following reason. Namely, in this case, noise is likely to be generated in an interconnection which connects the power module to the gate driver, and a filter circuit with a long delay time has to be provided in order to remove this noise. If the distance between the power module and the gate driver is 1 m or more like a control panel for an elevator or the like, the short-circuit protection circuit is more strongly affected by the noise.

In the case of the power module disclosed in the above-referenced Japanese Patent Laying-Open No. 2005-20843 (PTD 1), a short-circuit detection circuit provided for the gate driver detects reduction of the gate voltage and accordingly the fact that the RTC circuit is in the operating state is detected. However, in this case as well, the gate voltage is more strongly affected by the noise as the distance between the power module and the gate driver increases. Consequently, a filter with a long delay time is necessary for preventing malfunction, and thus there is a limit on shortening of the time taken from the start of operation of the RTC circuit in the start of operation of the short-circuit detection circuit for the gate driver.

The present invention has been made in view of the above-described problems, and an object of the present invention is to provide a short-circuit protection circuit that enables speedup of short-circuit protection for a self-arc-extinguishing type semiconductor element.

Solution to Problem

The present invention relates to a short-circuit protection circuit for a self-arc-extinguishing type semiconductor element. The self-arc-extinguishing type semiconductor element includes a first main electrode, a second main electrode, and a control electrode, and is configured to be switched on to be conductive between the first main electrode and the second main electrode or switched off to be non-conductive between the first main electrode and the second main electrode, in response to a drive voltage supplied between the control electrode and the first main electrode. The short-circuit protection circuit includes a first protection circuit and a second protection circuit. The first protection circuit is configured to reduce a voltage between the control electrode and the first main electrode when detecting overcurrent flowing between the first main electrode and the second main electrode. The second protection circuit is configured to detect current flowing in an interconnection adapted to supply the drive voltage; determine, based on the detected current, whether the first protection circuit is in an operating state; and change the drive voltage to turn off the self-arc-extinguishing type semiconductor element when the first protection circuit is in the operating state.

Advantageous Effects of Invention

In accordance with the present invention, the second protection circuit is configured to detect current flowing in the interconnection adapted to supply the drive voltage, and thereby determine whether the first protection circuit is in an operating state or not. Because the amount of noise included in the detected current is relatively small, a filter circuit with a large time constant is unnecessary and therefore the short-circuit protection can be speeded up.

DESCRIPTION OF EMBODIMENTS

Figure 1:
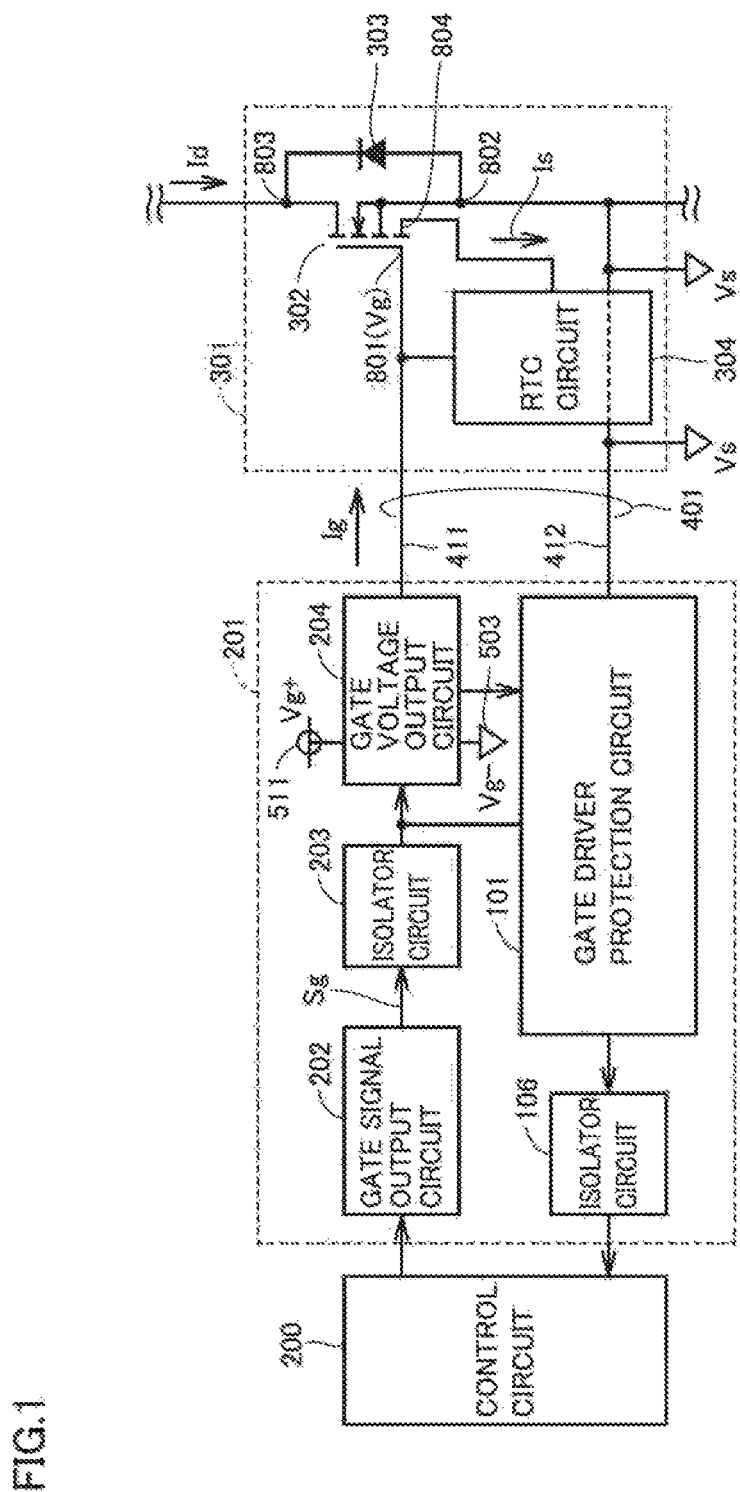
FIG. 1 is a block diagram schematically showing a configuration of a short-circuit protection circuit for a self-arc-extinguishing type semiconductor element in a first embodiment.

Each embodiment will hereinafter be described in detail with reference to the drawings. It should be noted that the same or corresponding components are denoted by the same reference characters, and a description thereof may not be repeated depending on the case.

First Embodiment

[Schematic Configuration of Short-Circuit Protection Circuit]

FIG. 1 is a block diagram schematically showing a configuration of a short-circuit protection circuit for a self-arc-extinguishing type semiconductor element in a first embodiment. The short-circuit protection circuit is provided for preventing a self-arc-extinguishing type semiconductor element 302 from being broken when short-circuit current (overcurrent) flows in self-arc-extinguishing type semiconductor element 302.

Referring to FIG. 1, the short-circuit protection circuit includes an RTC (Real-Time Current Control) circuit 304 provided in a power module 301, and a gate driver side protection circuit 101 provided in a gate driver 201. In particular, gate driver side protection circuit 101 is characterized by the fact that it determines, based on change of current Ig which is output from gate driver 201 to power module 301 (the current is hereinafter referred to as gate current Ig), whether RTC circuit 304 is in an operating state or not. It should be noted that RTC circuit 304 may herein be referred to as first protection circuit and gate driver side protection circuit 101 may herein be referred to as second protection circuit.

Specifically, power module 301 includes self-arc-extinguishing type semiconductor element 302, a diode 303, and RTC circuit 304.

Self-arc-extinguishing type semiconductor element 302 includes a first main electrode 802, a second main electrode 803, and a control electrode 801, and is configured to be switched on to allow current to flow between the first main electrode and the second main electrode or switched off not to allow current to flow therebetween, in response to a signal (gate voltage Vg) applied to control electrode 801. Self-arc-extinguishing type semiconductor element 302 further includes a sense electrode 804. From sense electrode 804, sense current Is flows which is proportional to main current Id flowing from the second main electrode to the first main electrode.

Self-arc-extinguishing type semiconductor element 302 is for example MOSFET (Metal-Oxide-Semiconductor Field-Effect Transistor), IGBT, or bipolar transistor or the like. For self-arc-extinguishing type semiconductor element 302, a semiconductor material such as silicon or silicon carbide or the like can be used.

FIG. 1 shows, by way of example, the case where self-arc-extinguishing type semiconductor element 302 is an N-channel MOSFET. First main electrode 802 of self-arc-extinguishing type semiconductor element 302 corresponds to the source of the MOSFET and corresponds to the emitter of the IGBT and the bipolar transistor. Second main electrode 803 corresponds to the drain of the MOSFET and corresponds to the collector of the IGBT and the bipolar transistor. Control electrode 801 corresponds to the gate of the MOSFET and the IGBT and corresponds to the base of the bipolar transistor. The potential of first main electrode 802 is hereinafter referred to as reference potential Vs.

Diode 303 is a so-called freewheel diode and connected in antiparallel to self-arc-extinguishing type semiconductor element 302. Namely, the anode of diode 303 is connected to first main electrode 802 of self-arc-extinguishing type semiconductor element 302 and the cathode of diode 303 is connected to second main electrode 803 of self-arc-extinguishing type semiconductor element 302.

RTC circuit 304 detects the magnitude of sense current Is (or may detect the magnitude of main current Id of self-arc-extinguishing type semiconductor element 302), and operates to reduce gate voltage Vg of self-arc-extinguishing type semiconductor element 302 when the magnitude of sense current Is exceeds a threshold value. A more specific example of the circuit configuration will be described later herein with reference to FIG. 2.

Recently, for the self-arc-extinguishing type semiconductor element, there have been demands for downsizing, increase of the current density, speedup of the switching operation, reduction of the switching loss, and the like, and accordingly the need to further speed up the short-circuit protecting operation has increased. RTC circuit 304 can be provided in power module 301 to speedily reduce gate voltage Vg upon detection of short-circuit current and thereby suppress increase of main current Id.

Aforementioned power module 301 and gate driver 201 are connected to each other through a gate driver-to-power module interconnection 401 (a gate interconnection 411 and a reference potential interconnection 412). Gate interconnection 411 (also referred to as control interconnection) is provided for transmitting a drive voltage which is output from gate driver 201 to apply the drive voltage between control electrode 801 and first main electrode 802 of self-arc-extinguishing type semiconductor element 302. Reference potential interconnection 412 is provided for transmitting reference potential Vs to gate driver 201.

Gate driver 201 includes a gate signal output circuit 202, isolator circuits 203, 106, a gate voltage output circuit 204, and gate driver side protection circuit 101.

Gate signal output circuit 202 outputs an ON signal for driving self-arc-extinguishing type semiconductor element 302 into an ON state and an OFF signal for driving self-arc-extinguishing type semiconductor element 302 into an OFF state, in response to a control signal from a control circuit 200. The ON signal and the OFF signal are herein collectively referred to as gate signal Sg. For example, the ON signal corresponds to a first logic level of gate signal Sg and the OFF signal corresponds to a second logic level of gate signal Sg.

Gate voltage output circuit 204 receives gate signal Sg (ON signal and OFF signal) from gate signal output circuit 202 through isolator circuit such as a photocoupler. Gate voltage output circuit 204 outputs the drive voltage according to one of the ON signal and the OFF signal to control electrode 801 (gate) of self-arc-extinguishing type semiconductor element 302 through gate interconnection 411. Accordingly, self-arc-extinguishing type semiconductor element 302 is switched on or off.

More specifically, gate voltage output circuit 204 is connected to a power supply node 511 which supplies positive power supply potential Vg+ and a power supply node 503 which supplies a negative power supply potential Vg−. Gate voltage output circuit 204 is configured to supply, to control electrode 801 of self-arc-extinguishing type semiconductor element 302, positive power supply potential Vg+ or negative power supply potential Vg− as the drive voltage, depending on the logic level of gate signal Sg. In the case where self-arc-extinguishing type semiconductor element 302 is the N-channel MOSFET shown in FIG. 1, MOSFET 302 is turned on when positive power supply potential Vg+ is supplied to control electrode 801 while MOSFET 302 is turned off when negative power supply potential Vg− is supplied to control electrode 801. It should be noted that reference potential Vs can also be used instead of negative power supply potential Vg−.

Gate driver side protection circuit 101 determines, based on change of current Ig (gate current Ig) which is output from gate voltage output circuit 204 to power module 301, whether RTC circuit 304 is in an operating state or not. When RTC circuit 304 is in a non-operating state (namely in a normal state where short-circuit current is not detected), gate current Ig flows when self-arc-extinguishing type semiconductor element 302 is being switched on or off; however gate current Ig is substantially zero during a period other than the time when self-arc-extinguishing type semiconductor element 302 is being switched on or off. In contrast, when RTC circuit 304 is in the operating state, gate current Ig flows through RTC circuit 304 even during the period other than the time when self-arc-extinguishing type semiconductor element 302 is being switched on or off. Gate driver side protection circuit 101 detects this gate current Ig which flows during the period other than the time when self-arc-extinguishing type semiconductor element 302 is being switched on or off, to thereby detect that RTC circuit 304 is in the operating state.

When gate driver side protection circuit 101 detects that RTC circuit 304 is in the operating state, gate driver side protection circuit 101 temporarily blocks the ON signal which is output from gate signal output circuit 202 to thereby drive self-arc-extinguishing type semiconductor element 302 into the OFF state. Further, gate driver side protection circuit 101 outputs a fault detection signal (Fo signal) to control circuit 200 through isolator circuit 106 such as photocoupler. In response to the fault detection signal (Fo signal) received from gate driver side protection circuit 101, control circuit 200 outputs a control signal to gate signal output circuit 202 for turning off self-arc-extinguishing type semiconductor element 302. Accordingly, the output of gate signal output circuit 202 is switched from the ON Signal to the OFF signal.

[Detailed Configuration of Short-Circuit Protection Circuit]

Figure 2:
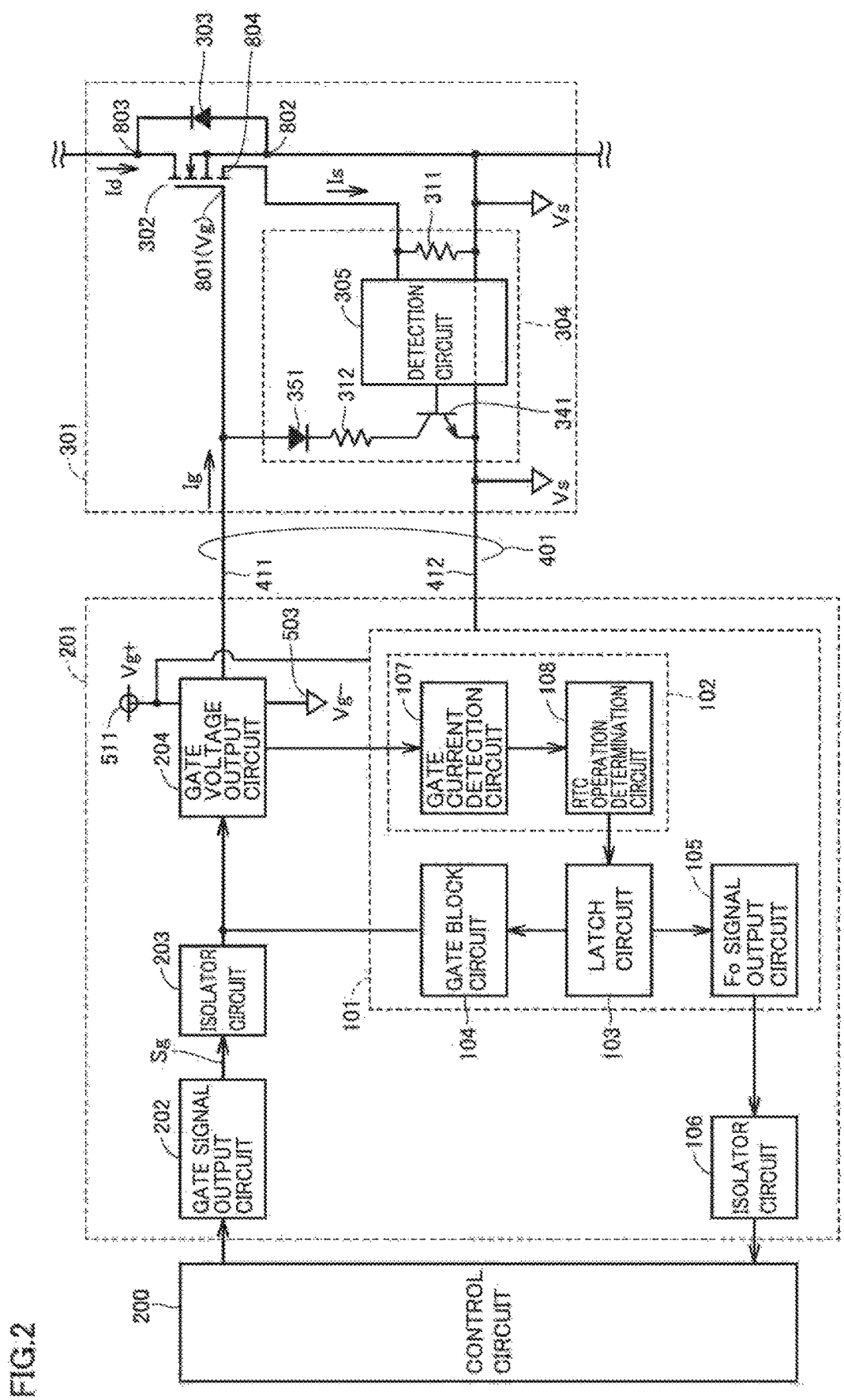
FIG. 2 is a diagram showing a more detailed configuration of an RTC circuit and a gate driver side protection circuit in FIG. 1.

FIG. 2 is a diagram showing a more detailed configuration of the RTC circuit and the gate driver side protection circuit in FIG. 1.

Referring to FIG. 2, RTC circuit 304 includes resistance elements 311, 312, a short-circuit current detection circuit 305, a diode 351, and a semiconductor switching element 341.

Resistance element 311 is connected between sense electrode 804 of self-arc-extinguishing type semiconductor element 302 and reference potential interconnection 412. Resistance element 311 is used as a current sense resistor for detecting sense current Is.

Diode 351, resistance element 312, and semiconductor switching element 341 are connected in series in this sequence between gate interconnection 411 and reference potential interconnection 412, and the forward direction of diode 351 corresponds to this sequence. Semiconductor switching element 341 may either be MOSFET or bipolar transistor, for example. FIG. 2 shows, by way of example, semiconductor switching element 341 which is an NPN-type bipolar transistor. A control electrode (gate or base) of semiconductor switching element 341 is connected to detection circuit 305.

Detection circuit 305 detects the voltage across resistance element 311 and determines whether the detected voltage exceeds a threshold value or not. When the voltage across resistance element 311 exceeds the threshold value, detection circuit 305 switches semiconductor switching element 341 from the OFF state to the ON state. Accordingly, gate current Ig is allowed to flow through diode 351, resistance element 312, and semiconductor switching element 341.

Gate driver side protection circuit 101 includes a gate block command output circuit 102, a latch circuit 103, a gate block circuit 101, and an Fo signal output circuit 105.

Gate block command output circuit 102 includes a gate current detection circuit 107 and an RTC operation determination circuit 108. Gate current detection circuit 107 detects gate current Ig which is output from gate voltage output circuit 204 to power module 301. Based on the magnitude of the gate current detected by gate current detection circuit 107, RTC operation determination circuit 108 determines whether RTC circuit 304 is in the operating state or not. When RTC operation determination circuit 108 determines that RTC circuit 304 is in the operating state, RTC operation determination circuit 108 outputs a gate block command signal to latch circuit 103.

Latch circuit 103 temporarily holds the gate block command signal received from RTC operation determination circuit 108, and outputs the held gate block command signal to gate block circuit 104 and Fo signal output circuit 105.

When gate block circuit 104 is receiving the gate block command signal from latch circuit 103, gate block circuit 104 operates to block the ON signal which is being output from gate signal output circuit 202 to gate voltage output circuit 204 through isolator circuit 203. As a result of this, a voltage (reference potential Vs or negative power supply potential Vg–, for example) which is lower than a threshold voltage of self-arc-extinguishing type semiconductor element 302 is output from gate voltage output circuit 204 to control electrode 801 of self-arc-extinguishing type semiconductor element 302.

When Fo signal output circuit 105 is receiving the gate block command signal from latch circuit 103, Fo signal output circuit 105 outputs the fault detection signal (Fo signal) to control circuit 200 through isolator circuit 106. In response to the fault detection signal (Fo signal), control circuit 200 outputs a control signal to gate signal output circuit 202 for turning off self-arc-extinguishing type semiconductor element 302. As a result of this, the output of gate signal output circuit 202 is switched from the ON signal to the OFF signal, and a drive voltage corresponding to this OFF signal is output from gate voltage output circuit 204 to control electrode 801 of self-arc-extinguishing type semiconductor element 302.

It should be noted that a delay time from the reception of the gate block command signal by latch circuit 103 to the ultimate switching of the output voltage of gate voltage output circuit 204 to the voltage (negative power supply potential Vg–) corresponding to the OFF signal varies depending on the specifications of control circuit 200 and gate driver 201. The delay time may be on the order of a few milliseconds. Latch circuit 103 is therefore required to be configured to keep holding the gate block command signal for this delay time.

Alternatively, latch circuit 103 may be configured to serve as an RS (Reset-Set) latch circuit holding the gate block command signal until a reset signal is input. In this case, control circuit 200 is configured to output the reset signal to latch circuit 103 after causing gate signal output circuit 202 to output the OFF signal.

[Example of Application to Power Converter]

Figure 3:
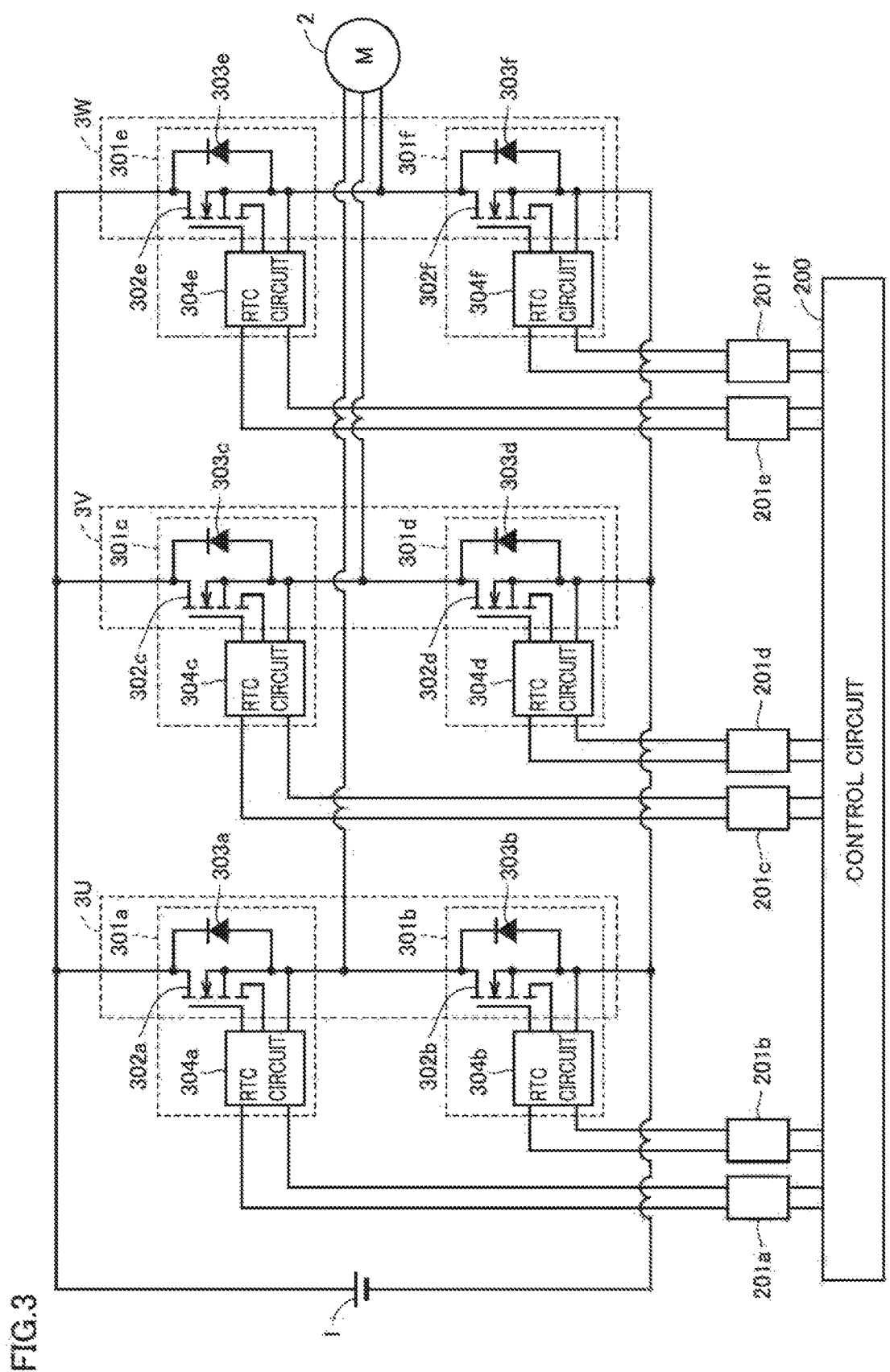
FIG. 3 is a diagram showing an example where the short-circuit protection circuit in FIGS. 1 and 2 is applied to a power converter.

FIG. 3 is a diagram showing an example where the short-circuit protection circuit in FIGS. 1 and 2 is applied to a power converter. The power converter in FIG. 3 is a three-phase inverter circuit which converts DC power to three-phase AC power and outputs the resultant three-phase AC power to a load 2 such as motor (M).

Referring to FIG. 3, the three-phase inverter circuit includes a U-phase AC output circuit 3U, a V-phase AC output circuit 3V, and a W-phase AC output circuit 3W which are connected in parallel to one another between the positive electrode and the negative electrode of a DC power supply 1. U-phase AC power, V-phase AC power, and W-phase AC power are output respectively from AC output circuits 3U, 3V, and 3W to load 2.

Each of the U, V, and W-phase AC output circuits 3U, 3V, 3W includes two self-arc-extinguishing type semiconductor elements connected in series to each other, and two diodes connected in antiparallel to respective self-arc-extinguishing type semiconductor elements. For example, U-phase AC output circuit 3U includes two self-arc-extinguishing type semiconductor elements 302a, 302b connected in series to each other, and diodes 303a, 303b connected in antiparallel to self-arc-extinguishing type semiconductor elements 302a, 302b, respectively. This is applied as well to the V phase and the W phase. Namely, AC output circuit 3V includes two self-arc-extinguishing type semiconductor elements 302c, 302d and two diodes 303c, 303d, and AC output circuit 3W includes two self-arc-extinguishing type semiconductor elements 302e, 302f and two diodes 303e, 303f.

Like the short-circuit protection circuit for the self-arc-extinguishing type semiconductor element described above in connection with FIGS. 1 and 2, RTC circuits 304a to 304f are connected to self-arc-extinguishing type semiconductor elements 302a to 302f, respectively. Power modules 301a to 301f include therein respective RTC circuits 304a to 304f, respective self-arc-extinguishing type semiconductor elements 302a to 302f, and respective diodes 303a to 303f. Power modules 301a to 301f are connected respectively to gate drivers 201a to 201f for being driven. Gate drivers 201a to 201f are connected to control circuit 200 which controls all of the U, V, and W phases.

As to the above-described AC output circuits 3U, 3V, 3W, RTC circuits 304a to 304f, and gate drivers 201a to 201f, the U phase configuration, the V phase configuration, and the W phase configuration are identical to one another. Therefore, a cause of short circuit will be described in the following in connection with the U phase by way of example.

Control circuit 200 controls self-arc-extinguishing type semiconductor elements 302a, 302b which are components of U-phase AC output circuit 3U so that self-arc-extinguishing type semiconductor elements 302a, 302b are alternately and repeatedly turned on/off. Namely, self-arc-extinguishing type semiconductor elements 302a and 302b are controlled so that one of self-arc-extinguishing type semiconductor elements 302a and 302b is ON while the other is OFF. It is supposed here that in U-phase AC output circuit 3U, an ON signal which erroneously causes self-arc-extinguishing type semiconductor elements 302a and 302b to be simultaneously ON is applied to AC output circuit 3U. In this case, the positive electrode and the negative electrode of DC power supply 1 are short-circuited with a low impedance, and therefore, large short-circuit current flows in self-arc-extinguishing type semiconductor elements 302a and 302b. As a result of this, there is a possibility that self-arc-extinguishing type semiconductor elements 302a, 302b are broken due to the short-circuit current. In view of this, RTC circuit 304 and gate driver side protection circuit 101 described above in connection with FIGS. 1 and 2 are provided as the short-circuit protection circuit for each power module.

[Operation of Short-Circuit Protection Circuit]

Figure 4:
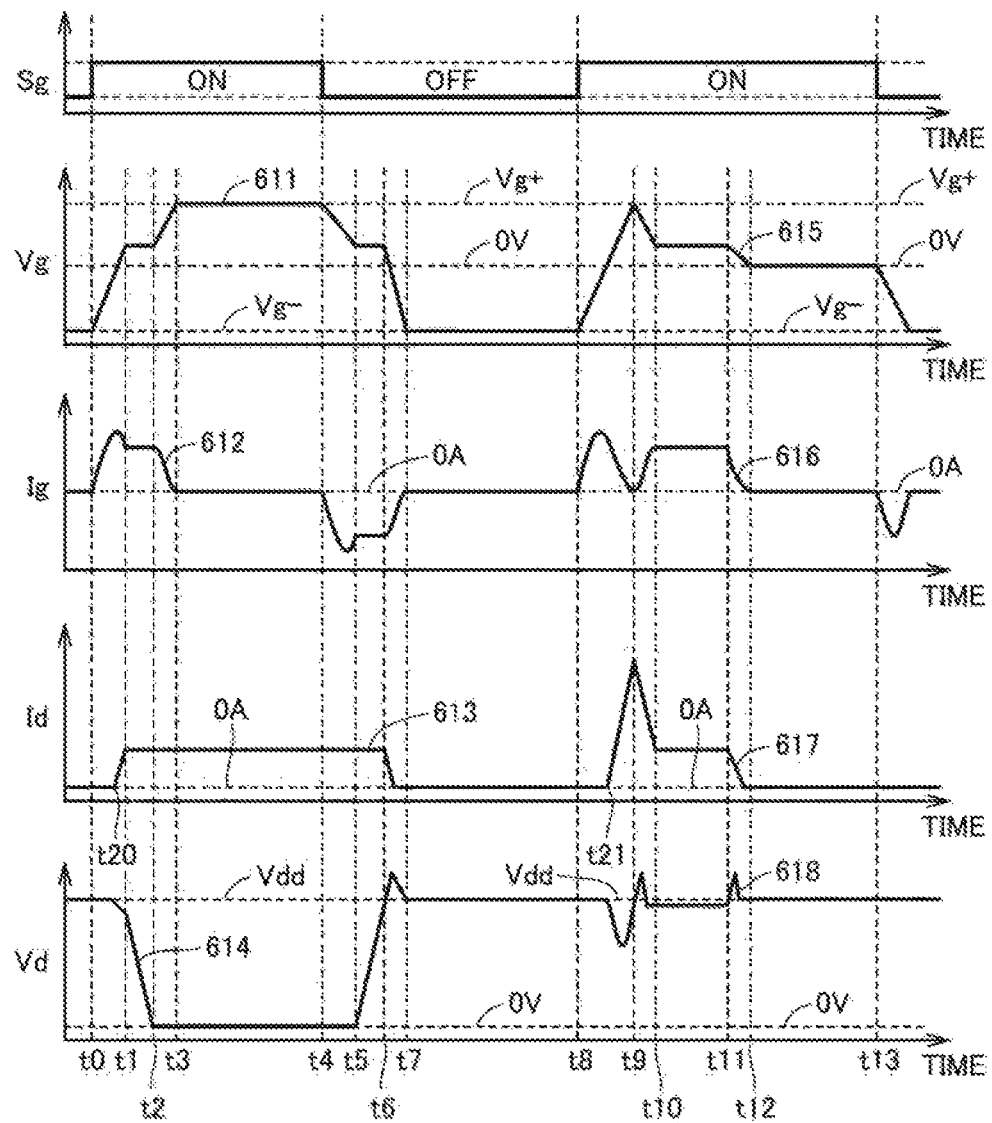
FIG. 4 is a timing diagram showing an example of the operation of the short-circuit protection circuit in the first embodiment.

FIG. 4 is a timing diagram showing an example of the operation of the short-circuit protection circuit in the first embodiment. In FIG. 4, a waveform of gate signal Sg which is output from gate signal output circuit 202 and respective waveforms of gate voltage Vg, gate current Ig, main current Id, and inter-main-electrode voltage Vd (voltage between second main electrode 803 and first main electrode 802) of self-arc-extinguishing type semiconductor element 302 are shown in this order from the top.

Waveforms 611 to 614 which are shown from time t0 to time t7 are those in a normal switching operation (hereinafter referred to as "normal operation"). In this case, the short-circuit protection circuit is not operating. Waveforms 615 to 618 which are shown from time t8 are those when short-circuit current flows in self-arc-extinguishing type semiconductor element 302 (hereinafter referred to as "short-circuit operation"). In this case, the short-circuit protection circuit is operating. In the example of the inverter circuit in FIG. 3, the operation in which only one of self-arc-extinguishing type semiconductor elements 302a and 302b of U-phase AC output circuit 3U is ON corresponds to the normal operation, while the operation in which both self-arc-extinguishing type semiconductor elements 302a and 302b are erroneously ON at the same time corresponds to the short-circuit operation.

Further, in FIG. 4, gate voltage Vg of self-arc-extinguishing type semiconductor element 302 represents the potential of control electrode 801 with respect to first main electrode 802, and inter-main-electrode voltage Vd represents the potential of second main electrode 803 with respect to first main electrode 802. Therefore, when the potential of control electrode 801 is equal to the potential of first main electrode 802 (namely reference potential Vs), gate voltage Vg is 0 V. When the potential of second main electrode 803 is equal to the potential of first main electrode 802 (namely reference potential Vs), inter-main-electrode voltage Vd is 0 V.

It should be noted that the short-circuit protection circuit in FIGS. 1 and 2 operate without problems even when negative power supply potential Vg− is equal to reference potential Vs (0 V). In order to clearly distinguish between the case where gate voltage Vg becomes 0 V, regardless of gate signal Sg, in response to the operation of gate block circuit 104 in FIG. 2, and the case where the OFF signal is output from gate signal output circuit 202 in FIG. 2, the output of gate voltage output circuit 204 in response to the OFF signal is herein set to negative power supply potential Vg−.

1. In Normal Operation

In the following, with reference to FIGS. 2 and 4, respective operations of power module 301 and gate driver 201 in the normal operation will be described first.

At time t0 in FIG. 4, in response to a control signal from control circuit 200, gate signal Sg which is output from gate signal output circuit 202 is switched from the OFF signal (OFF) to the ON signal (ON). In response to this switching of gate signal Sg, the output of gate voltage output circuit 204 is switched to positive power supply potential Vg+. Accordingly self-arc-extinguishing type semiconductor element 302 starts a turn-on operation.

In the turn-on operation (from time t0 to time t3), a parasitic capacitance of control electrode 801 of self-arc-extinguishing type semiconductor element 302 is charged. Accordingly, gate current Ig flows and gate voltage Vg (voltage between first main electrode 802 and control electrode 801) increases.

When gate voltage Vg exceeds a threshold voltage of self-arc-extinguishing type semiconductor element 302 (time t20), main current Id starts flowing from second main electrode 803 to first main electrode 802. Due to the parasitic inductance of the power module, a voltage drop depending on change of main current Id occurs. Therefore, voltage Vd between the first and second main electrodes decreases from bus line voltage Vdd (voltage of DC power supply 1 in FIG. 3, for example).

The period from time t1 to time t2 is a mirror period in which gate voltage Vg is constant because of the mirror effect of self-arc-extinguishing type semiconductor element 302. In the mirror period, since a parasitic capacitance of self-arc-extinguishing type semiconductor element 302 varies due to variation of inter-main-electrode voltage Vd, gate voltage Vg is constant. When the mirror for period ends at time t2, gate voltage Vg starts increasing again. At time t3 the gate voltage reaches positive power supply voltage Vg+ and according a turn-on period ends.

Next, a turn-off period from time t4 to time t7 will be described. At time t4, in response to a control signal from control circuit 200, gate signal Sg which is output from gate signal output circuit 202 is switched from the ON signal (ON) to the OFF signal (OFF). In response to this switching of gate signal Sg, the output of gate voltage output circuit 204 is switched to negative power supply potential Vg−. Accordingly self-arc-extinguishing type semiconductor element 302 starts a turn-off operation. In the turn-off operation, a parasitic capacitance of self-arc-extinguishing type semiconductor element 302 is discharged. Therefore, gate voltage Vg decreases and gate current Ig in the opposite direction to the direction in the turn-on operation flows. In the period from time t4 to time t5, main current Id and inter-main-electrode voltage Vd do not change.

At time t5, inter-main-electrode voltage Vd starts increasing. Thus, the period from time t5 to time t6 is a mirror period in which gate voltage Vg is substantially constant. When the mirror period ends at time t6, gate voltage Vg starts decreasing again.

When gate voltage Vg becomes lower than the threshold voltage of self-arc-extinguishing type semiconductor element 302, main current Id stops flowing, and the turn-off operation ends at time t7.

From time t1 to time t6, drain current Id increases/decreases with a slope depending on the load connected to self-arc-extinguishing type semiconductor element 302. Drain current Id, however, is herein indicated as having a constant value for the sake of convenience.

It should be noted that the short-circuit protection circuit in the first embodiment determines, based on gate current Ig, whether RTC circuit 304 is in the operating state or not, and therefore, it is necessary to prevent malfunction of gate driver side protection circuit 101 when gate current Ig flows. Accordingly, RTC operation determination circuit 108 in FIG. 2 is equipped with a filter circuit which adjusts the voltage level of the output of gate current detection circuit 107, or equipped with a mask circuit for masking the output of gate current detection circuit 107 during the turn-on period. An example of the specific configuration of RTC operation determination circuit 108 will be described in detail in connection with second to fifth embodiments.

2. In Short-Circuit Operation

Next, respective operations of power module 301, gate driver 201, and the short-circuit protection circuit in the short-circuit operation will be described. The short-circuit operation herein refers to an operation which is performed when the ON signal is input to both U-phase self-arc-extinguishing type semiconductor elements 302a, 302b of the three-phase inverter shown in FIG. 3, for example. In this case, the positive electrode and the negative electrode of DC power supply 1 are short-circuited with a low impedance, and therefore, voltage Vdd of DC power supply 1 is shared among self-arc-extinguishing type semiconductor elements 302a, 302b, and interconnections. The following description will be given in connection with an example where one of self-arc-extinguishing type semiconductor elements 302a and 302b has been in the ON state beforehand and the ON signal is applied afterward to the other self-arc-extinguishing type semiconductor element.

Referring to FIGS. 2 and 4, at time t8 in FIG. 4, in response to a control signal from control circuit 200, gate signal Sg which is output from gate signal output circuit 202 is switched from the OFF signal (OFF) to the ON signal (ON). In response to this switching of gate signal Sg, the output of gate voltage output circuit 204 is switched to positive power supply potential Vg+. Accordingly, self-arc-extinguishing type semiconductor element 302 starts the turn-on operation.

Figure 5:
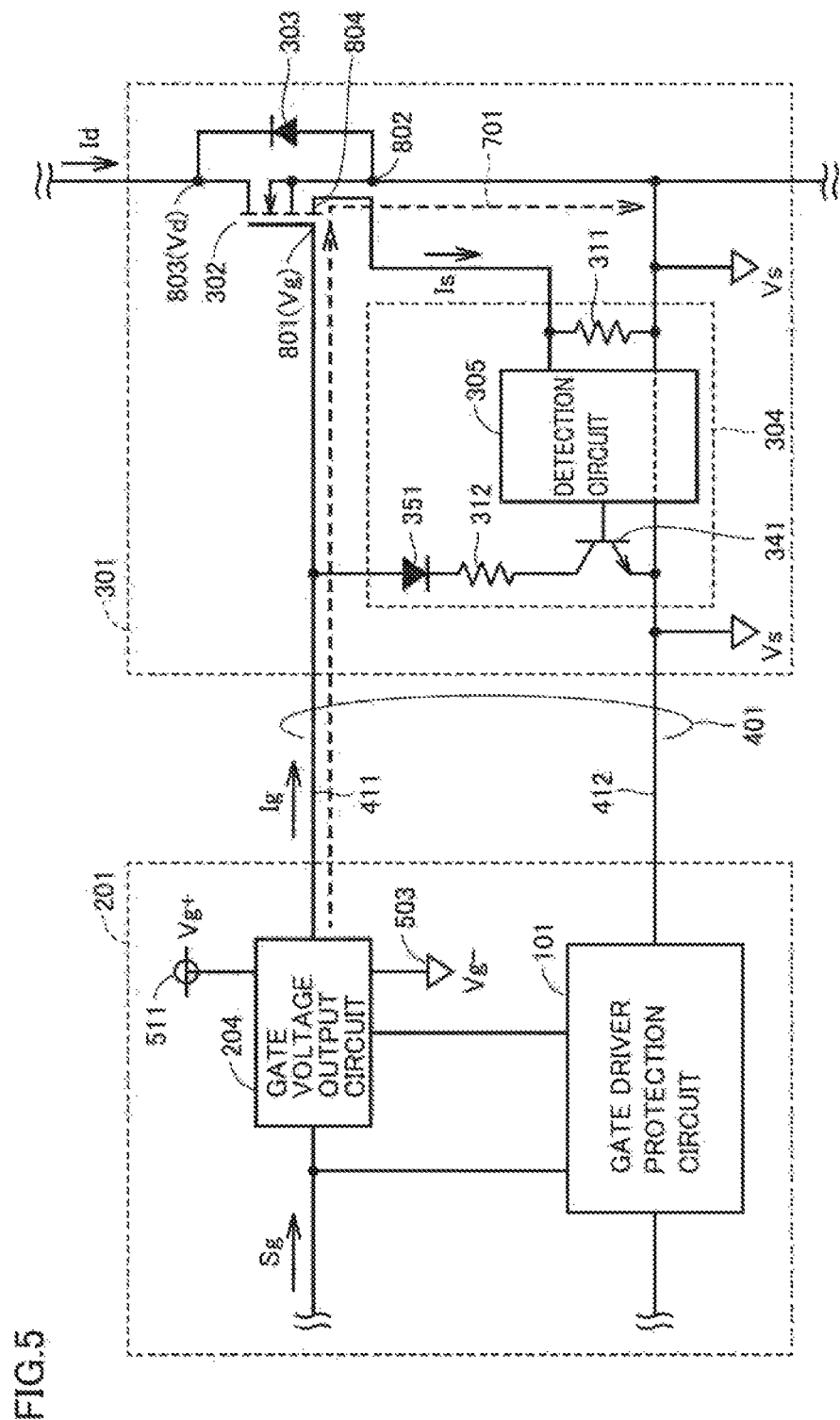
FIG. 5 is a diagram showing a current path for gate current from time t8 to time t9 in FIG. 4.

At time t8, self-arc-extinguishing type semiconductor element 302 starts the turn-on operation, and accordingly the parasitic capacitance of self-arc-extinguishing type semiconductor element 302 starts being charged. Thus, gate current Ig flows and gate voltage Vg (voltage between first main electrode 802 and control electrode 801) increases. FIG. 5 is a diagram showing a current path 701 for gate current Ig from time t8 to time t9 in FIG. 4.

In the period from time t8 to time t9, when gate voltage Vg exceeds the threshold voltage of self-arc-extinguishing type semiconductor element 302 (time t21), main current Id starts flowing from second main electrode 803 to first main electrode 802. Since there is no load in the short-circuit operation, main current Id in the short-circuit operation has a value (the value at time t9, for example) larger than main current Id in the normal operation (the value from time t1 to time t6, for example).

At time t21, main current Id starts flowing. Then, due to the parasitic inductance of the power module, a voltage drop depending on change of main current Id occurs. As a result of this, voltage Vd between the first and second main electrodes decreases from bus line voltage Vdd (the voltage of DC power supply 1 in FIG. 3, for example). In the normal operation, voltage Vd deceases to the ON voltage of the self-arc-extinguishing type semiconductor element and the load holds bus line voltage Vdd. In contrast, in the short-circuit operation, the decrease of voltage Vd is smaller because there is no load or the like. Moreover, in the short-circuit operation, the variation of the parasitic capacitance is also small and thus there is almost no mirror period. It should be noted that the other self-arc-extinguishing type semiconductor element is in the ON state herein for the sake of convenience; however, depending on the state of the other self-arc-extinguishing type semiconductor element, voltage Vd varies.

Further, when main current Id starts flowing at time t21, sense current Is which is proportional to main current Id flows in resistance element 311 (current sense resistor). As a result of this, a voltage is applied across resistance element 311 (current sense resistor). Since main current Id in the short-circuit operation is larger than main current Id in the normal operation, the voltage across resistance element 311 (current sense resistor) is larger than that in the normal operation.

At time t9, the voltage across resistance element 311 (current sense resistor) exceeds the threshold voltage which is a reference. Then, short-circuit current detection circuit 305 determines that short-circuit current flows in self-arc-extinguishing type semiconductor element 302 to thereby switch semiconductor switching element 341 to the ON state. Namely, RTC circuit 304 is driven into the operating state.

Figure 6:
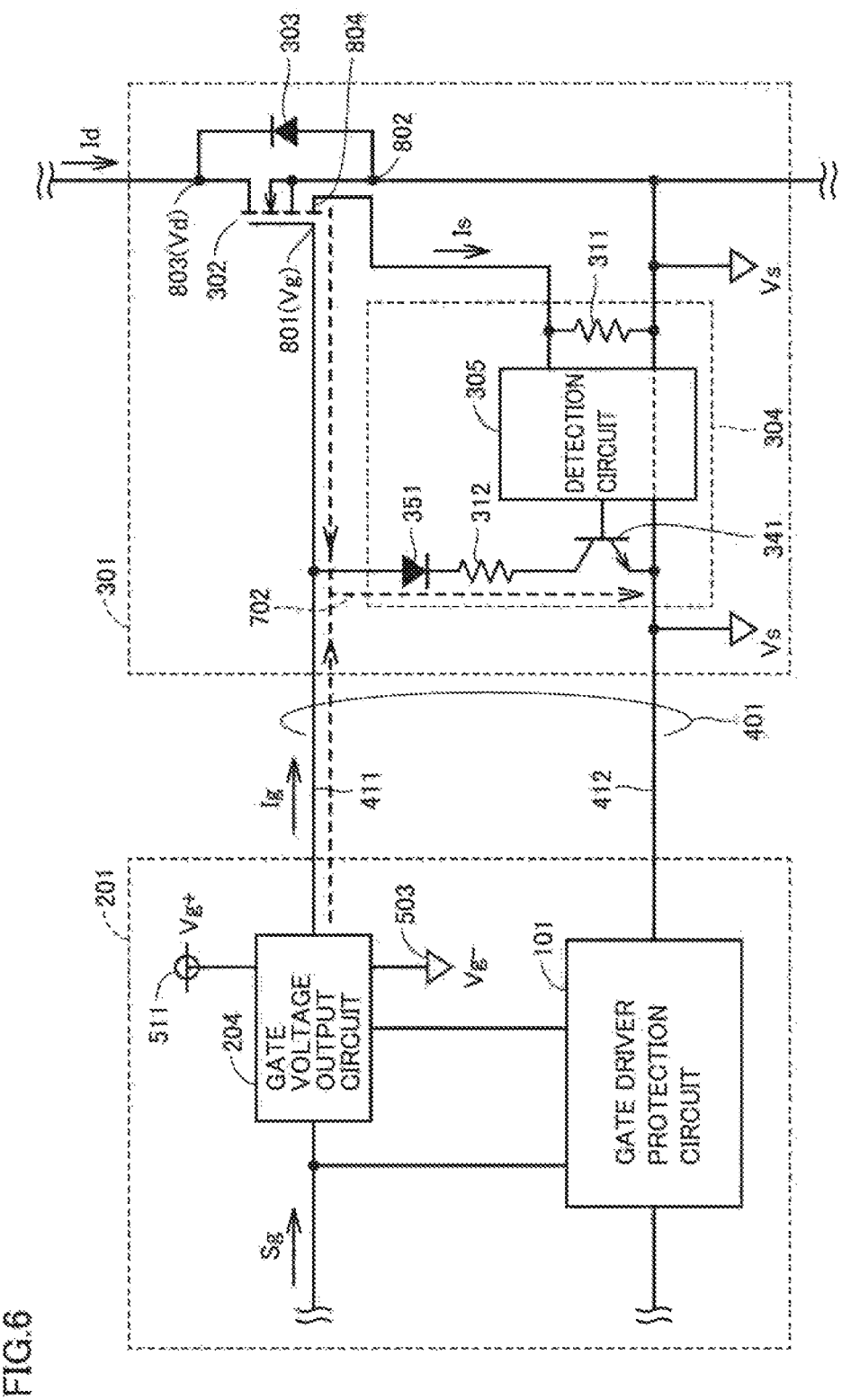
FIG. 6 is a diagram showing a current path for gate current from time t9 to time t11 in FIG. 4.

FIG. 6 is a diagram showing a current path 702 for gate current Ig from time t9 to time t11 in FIG. 4. Referring to FIGS. 4 and 6, when semiconductor switching element 341 becomes the ON state, the parasitic capacitance between control electrode 801 and first main electrode 802 of self-arc-extinguishing type semiconductor element 302 is discharged through diode 351, resistance element 312, and semiconductor switching element 341 as indicated by current path 702 in FIG. 6. In the period from time t9 to time t10, gate voltage Vg decreases to a divisional voltage generated by voltage division between resistance element 312 and a gate resistor in gate voltage output circuit 204. As a result of this, main current Id of self-arc-extinguishing type semiconductor element 302 also decreases.

Further, when semiconductor switching element 341 becomes the ON state, gate current Ig flows in the path extending from gate voltage output circuit 204 through diode 351, resistance element 312, and semiconductor switching element 341. In the normal operation, gate current Ig flows only in the period from time t0 to time t3. In contrast, in the short-circuit operation, gate current Ig keeps flowing during the period in which RTC circuit 304 is operating.

Referring again to FIGS. 2 and 4, the above-described flow of gate current Ig in the short-circuit operation is monitored by gate current detection circuit 107 provided in gate driver side protection circuit 101. When RTC operation determination circuit 108 determines that RTC circuit 304 is in the operating state, RTC operation determination circuit 108 outputs the gate block command signal to latch circuit 103. Latch circuit 103 holds the gate block start command received from RTC operation determination circuit 108.

At time t11, receiving the gate block command signal from latch circuit 103, gate block circuit 104 operates to block the ON signal which is output from gate signal output circuit 202 to gate voltage output circuit 204 through isolator circuit 203. Accordingly, in the period from time t11 to time t12, gate voltage Vg decreases to 0 V (reference potential Vs). It should be noted that gate signal output circuit 202 keeps outputting the ON signal to isolator circuit 203 even during this period.

In parallel with the above-described operation of gate block circuit 104, Fo signal output circuit 105 outputs the fault detection signal (Fo signal) to control circuit 200 through isolator circuit 106, upon receiving the gate block command signal from latch circuit 103.

In response to the fault detection signal (Fo signal), control circuit 200 outputs a control signal to gate signal output circuit 202 to thereby cause gate signal output circuit 202 to output the OFF signal. As a result of this, the output of gate signal output circuit 202 is switched from the ON signal to the OFF signal at time t13. When gate voltage output circuit 204 receives this OFF signal, the output of gate voltage output circuit 204 is switched to negative power supply potential Vg−, and accordingly the short-circuit protecting operation is completed.

FIG. 4 shows that gate driver side protection circuit 101 operates at time t11 to lower gate voltage Vg to 0 V and thereafter operates at time t13 to lower gate voltage Vg to negative power supply potential Vg−. Alternatively, at time t11, gate voltage Vg may be directly lowered to negative power supply potential Vg−.

[Modification]

The above-described short-circuit protection circuit is also applicable to the case where a plurality of power modules 301 shown in FIG. 2 are connected in parallel in order to adapt to increase of the capacity of the power conversion system. In this case, RTC circuit 304 is provided in each of power modules 301. In contrast, one gate driver 201 is enough for the plurality of power modules 301 connected in parallel to one another. Therefore, one gate driver side protection circuit 101 is provided.

As a material for above-described self-arc-extinguishing type semiconductor element 302, silicon carbide (SiC) can also be used other than silicon (Si).

Effects of First Embodiment

In the following, a description will be given of advantages of the short-circuit protection circuit in the first embodiment, as compared with the method disclosed in Japanese Patent Laying-Open No. 2005-20843 (PTD 1), namely the method according to which whether or not gate voltage Vg is lower than a reference voltage is determined and accordingly whether or not the RTC circuit is in the operating state is determined.

As shown in FIGS. 1 and 2, RTC circuit 304 and gate driver side protection circuit 101 are connected to each other by gate driver-to-power module interconnection 401. Therefore, in order to prevent gate driver side protection circuit 101 from malfunctioning due to high-frequency noise generated in this interconnection 401, it is necessary to provide gate driver side projection circuit 101 with an RC filter for removing the noise. In the case where whether the RTC circuit is in the operating state or not is determined based on the magnitude of gate voltage Vg like a conventional short-circuit protection circuit, an RC filter with a relatively large time constant is necessary to remove the high-frequency noise component included in gate voltage Vg. As a result of this, there has been a limit on shortening of the time taken for the short-circuit protection for the self-arc-extinguishing type semiconductor element.

In contrast, the short-circuit protection circuit in the first embodiment determines whether RTC circuit 304 is in the operating state or not, based on variation of the gate current. In this case, as gate driver-to-power module interconnection 401 is longer, the high-frequency impedance of interconnection 401 is larger and therefore high-frequency current hardly flows. Current variation due to the high-frequency noise is therefore smaller as compared with the voltage variation. As a result of this, the time constant of the RC filter for removing the high-frequency noise component included in gate current Ig can be reduced. Accordingly, the time taken for the short-circuit protection for the self-arc-extinguishing type semiconductor element can be shortened.

As seen from the above, the short-circuit protection circuit for the self-arc-extinguishing type semiconductor element in the first embodiment is less affected by noise, and enables reduction of the time constant of the RC filter for removing noise. As a result of this, the time from the start of operation of the RTC circuit to blockage of gate signal Sg (switching to the OFF signal) can be shortened, and the time taken for the short-circuit protection for the self-arc-extinguishing type semiconductor element can be shortened.

Further, the short-circuit protection circuit in the first embodiment has a merit that the configuration of the circuit for determining whether RTC circuit 304 is in the operating state or not is simplified relative to the conventional art disclosed in Japanese Patent Laying-Open No. 2005-20843 (PTD 1).

Specifically, referring to FIG. 4, in the period after completion of the turn-on operation in the normal operation (the period from time t3 to time t4, for example), a positive power supply voltage (Vg+) is applied as gate voltage Vg. In the period in which the RTC circuit is operating in the short-circuit operation (the period from time t10 to time t11, for example), a positive voltage (lower than Vg+) is applied. Therefore, in order to reliably detect based on gate voltage Vg, that the RTC circuit is operating, it is necessary, for example, to set in advance a voltage range including the voltage values indicated in the period from time t10 to time t11 in FIG. 4 and then determine whether or not the detected value of the gate voltage keeps falling in this set voltage range for a predetermined period.

In contrast, regarding gate current Ig, gate current Ig does not flow in the period (from time t3 to time t4, for example) after completion of the turn-on operation in the normal operation. In the period (from time t10 to time t11, for example) in which the RTC circuit is operating in the short-circuit operation, certain positive gate current Ig flows. Therefore, in order to reliably detect, based on gate current Ig, that the RTC circuit is operating, it is enough to detect that the detected value of the gate current is not continuously zero in a predetermined period. Thus, the circuit configuration of RTC operation determination circuit 108 can be simplified and the cost can be reduced, as compared with the conventional art determining whether gate voltage Vg falls in the set voltage range.

Second Embodiment

Regarding a second embodiment, an example of the specific configuration of gate driver side protection circuit 101 in FIG. 2 will be illustrated.

[Configuration of Gate Block Command Output Circuit]

Figure 7:
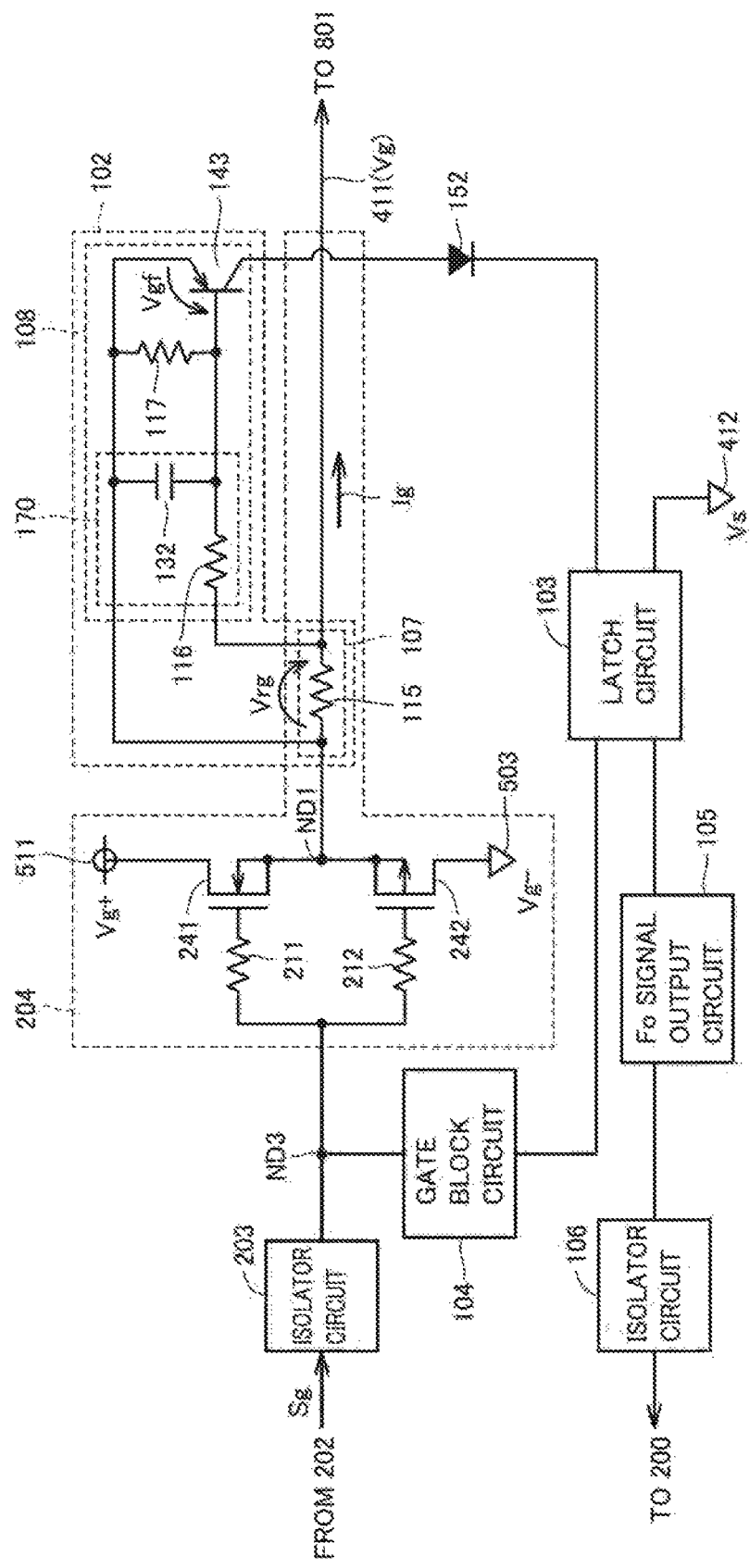
FIG. 7 is a circuit diagram showing a specific configuration of a gate block command output circuit used for a short-circuit protection circuit in a second embodiment.

FIG. 7 is a circuit diagram showing a specific configuration of a gate block command output circuit 102 used for a short-circuit protection circuit in the second embodiment. FIG. 7 also shows a specific configuration of gate voltage output circuit 204 in FIG. 2.

Referring to FIG. 7, gate voltage output circuit 204 is a so-called push-pull circuit and includes an N-type semiconductor switching element 241, a P-type semiconductor switching element 242, and resistance elements 211, 212, 115.

Semiconductor switching element 241 is connected between power supply node 511 which supplies positive power supply potential Vg+ and gate interconnection 411. Semiconductor switching element 242 is connected in series between power supply node 503 which supplies negative power supply potential Vg− and the gate interconnection. In the case of FIG. 7, an N-channel MOSFET and a P-channel MOSFET are used respectively as semiconductor switching elements 241 and 242. The drain of N-channel MOSFET 241 is connected to power supply node 511 and the drain of P-channel MOSFET 242 is connected to power supply node 503.

Resistance element 115 is disposed on gate interconnection 411, namely disposed between a connection node ND1 of semiconductor switching elements 241, 242 and control electrode 801 of self-arc-extinguishing type semiconductor element 302. Resistance element 115 is used as a gate resistor for self-arc-extinguishing type semiconductor element 302. The short-circuit protection circuit in the second embodiment is characterized by the fact that resistance element 115 is also used as a gate current detection resistor. Namely, gate current detection circuit 107 in FIG. 1 includes resistance element 115.

Resistance element 211 has one end connected to a control electrode (gate) of semiconductor switching element 241 and the other end connected to isolator circuit 203. Likewise, resistance element 212 has one end connected to a control electrode (gate) of semiconductor switching element 242 and the other end connected to isolator circuit 203.

RTC operation determination circuit 108 determines, based on voltage Vrg across resistance element 115 (gate resistor), whether RTC circuit 304 in FIG. 2 is in the operating state or not. As shown in FIG. 7, RTC operation determination circuit 108 includes an RC filter circuit 170 as a delay circuit, a resistance element 117, and a semiconductor switching element 143. It should be noted that a diode 152 is connected between semiconductor switching element 143 and latch circuit 103 so that the direction from semiconductor switching element 143 toward latch circuit 103 is the forward direction of diode 152.

Semiconductor switching element 143 includes a first main electrode, a second main electrode, and a control electrode, and is switched on to be conductive between the first and second main electrodes or switched off to be non-conductive between the first and second main electrodes, in response to a signal supplied to the control electrode. Semiconductor switching element 143 may either be bipolar transistor or MOSFET, for example. In the case of FIG. 7, semiconductor switching element 143 is a PNP-type bipolar transistor, by way of example. The first main electrode (emitter) of semiconductor switching element 143 is connected to connection node ND1 (between semiconductor switching elements 241 and 242), the second main electrode (collector) is connected to latch circuit 103, and the control electrode (base) is connected to RC filter circuit 170. As semiconductor switching element 143 is connected between connection node ND1 and latch circuit 103, an H level voltage signal is output as a gate block command signal to latch circuit 103 through diode 152 when both semiconductor switching elements 241, 143 are in the ON state in the turn-on operation.

RC filter circuit 170 is provided between resistance element 115 and semiconductor switching element 143. RC filter circuit 170 includes a resistance element 116 and a capacitor 132. The resistance element and capacitor 132 are connected in series to each other in this order between control electrode 801 of self-arc-extinguishing type semiconductor element 302 and connection node ND1, and are connected in parallel to resistance element 115. Capacitor 132 is connected in parallel to resistance element 117 and connected between the control electrode and the first main electrode of semiconductor switching element 143.

In the above-described configuration of RTC operation determination circuit 108, in response to gate current Ig flowing from power supply node 511 (positive power supply potential Vg+) to resistance element 115 when semiconductor switching element 241 is in the ON state, voltage Vrg which is proportional to gate current Ig is generated at resistance element 115. This voltage Vrg is input to the series circuit of resistance element 116 and capacitor 132 to cause the voltage across capacitor 132 to gradually increase (this increase is delayed relative to increase of voltage Vrg). The voltage across capacitor 132 is equal to voltage Vgf between the control electrode and the first main electrode of semiconductor switching element 143 (hereinafter also referred to as gate voltage Vgf of semiconductor switching element 143). Therefore, when voltage Vgf across capacitor 132 exceeds a threshold voltage of semiconductor switching element 143, semiconductor switching element 143 is turned on. As a result of this, a high-level (H level) voltage signal is input as a gate block command signal to latch circuit 103. Semiconductor switching element 143 thus functions as a determination unit determining whether RTC circuit 304 is in the operating state or not, based on whether voltage Vgf is higher than threshold voltage Vgfon.

Example of Configuration of Latch Circuit and Gate Block Circuit

Figure 8:
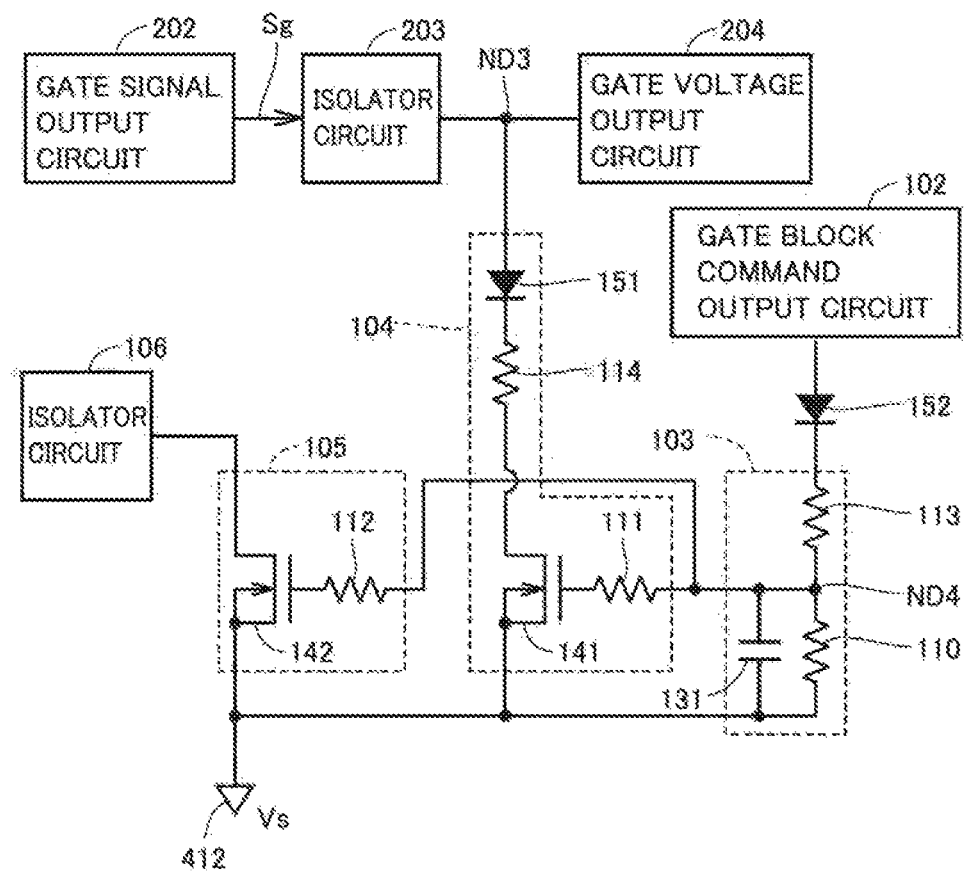
FIG. 8 is a circuit diagram showing an example of the configuration of a latch circuit, a gate block circuit, and an Fo signal output circuit in FIG. 7.

FIG. 8 is a circuit diagram showing an example of the configuration of latch circuit 103, gate block circuit 104, and Fo signal output circuit 105 in FIG. 7.

1. Latch Circuit

Referring to FIG. 8, latch circuit 103 includes resistance elements 113, 110 and a capacitor 131. Resistance elements 113 and 110 are connected in series in this order between the cathode of diode 152 and reference potential interconnection 412. Capacitor 131 is connected in parallel to resistance element 110.

In the above-described configuration of latch circuit 103, the H level voltage signal (gate block command signal) which is input from gate block command output circuit 102 is held in capacitor 131. The resistance values of resistance elements 131, 110 are set so that the voltage held in this capacitor 131 is sufficiently higher than the threshold voltage of semiconductor switching elements 141, 142. The time constant which is determined by capacitor 113 and resistance element 131 determines the time taken for a semiconductor switching element 141 to start operating, and the time for which the H level is held is determined by resistor 110 and capacitor 131. Therefore, depending on the use of the power module, respective magnitudes of the resistance value and the capacitance may be determined.

2. Gate Block Circuit

Gate block circuit 104 includes semiconductor switching element 141, a diode 151, and resistance elements 111, 114. In FIG. 8, the node on the interconnection connecting isolator circuit 203 and gate voltage output circuit 204 to each other is indicated by ND3. The connection node of resistance elements 113, 110 is indicated by ND4.

Semiconductor switching element 141 includes a first main electrode, a second main electrode, and a control electrode, and is switched on to allow current to flow between the first main electrode and the second main electrode or switched off not to allow current to flow between the first main electrode and the second main electrode, in response to a signal supplied to the control electrode. In the case of FIG. 8, semiconductor switching element 141 is an N-channel MOSFET by way of example, and the first main electrode, the second main electrode, and the control electrode correspond respectively to source, drain, and gate.

As shown in FIG. 8, diode 151, resistance element 114, and semiconductor switching element 141 are connected in series in this order between node ND3 and reference potential interconnection 412. The control electrode of semiconductor switching element 141 is connected to connection node ND4 through resistance element 111.

In the above-described configuration of gate block circuit 104, semiconductor switching element 141 is in the ON state in the period in which an H-level voltage higher than the threshold voltage of semiconductor switching element 141 is held in capacitor 131. As a result of this, even when the ON signal is output from gate signal output circuit 202, the potential of node ND3 is fixed at a value substantially equal to reference potential Vs. Namely the ON signal which is output from gate signal output circuit 202 is blocked.

3. Fo Signal Output Circuit

Fo signal output circuit 105 includes a semiconductor switching element 142 and a resistance element 112.

Semiconductor switching element 142 is an N-channel MOSFET by way of example, like semiconductor switching element 141, and includes a first main electrode (source), a second main electrode (drain), and a control electrode (gate). Semiconductor switching element 142 is connected between isolator circuit 106 and reference potential interconnection 412. The control electrode of semiconductor switching element 142 is connected to connection node ND4 through resistance element 112.

In the above-described configuration of Fo signal output circuit 105, semiconductor switching element 142 is in the ON state in the period in which an H level voltage higher than the threshold voltage of semiconductor switching element 142 is held in capacitor 131. Accordingly, the low level (L level) voltage signal corresponding to reference potential Vs is output as the fault detection signal (Fo signal) to control circuit 200 in FIG. 2 through isolator circuit 106.

[Operation of Short-Circuit Protection Circuit]

Figure 9:
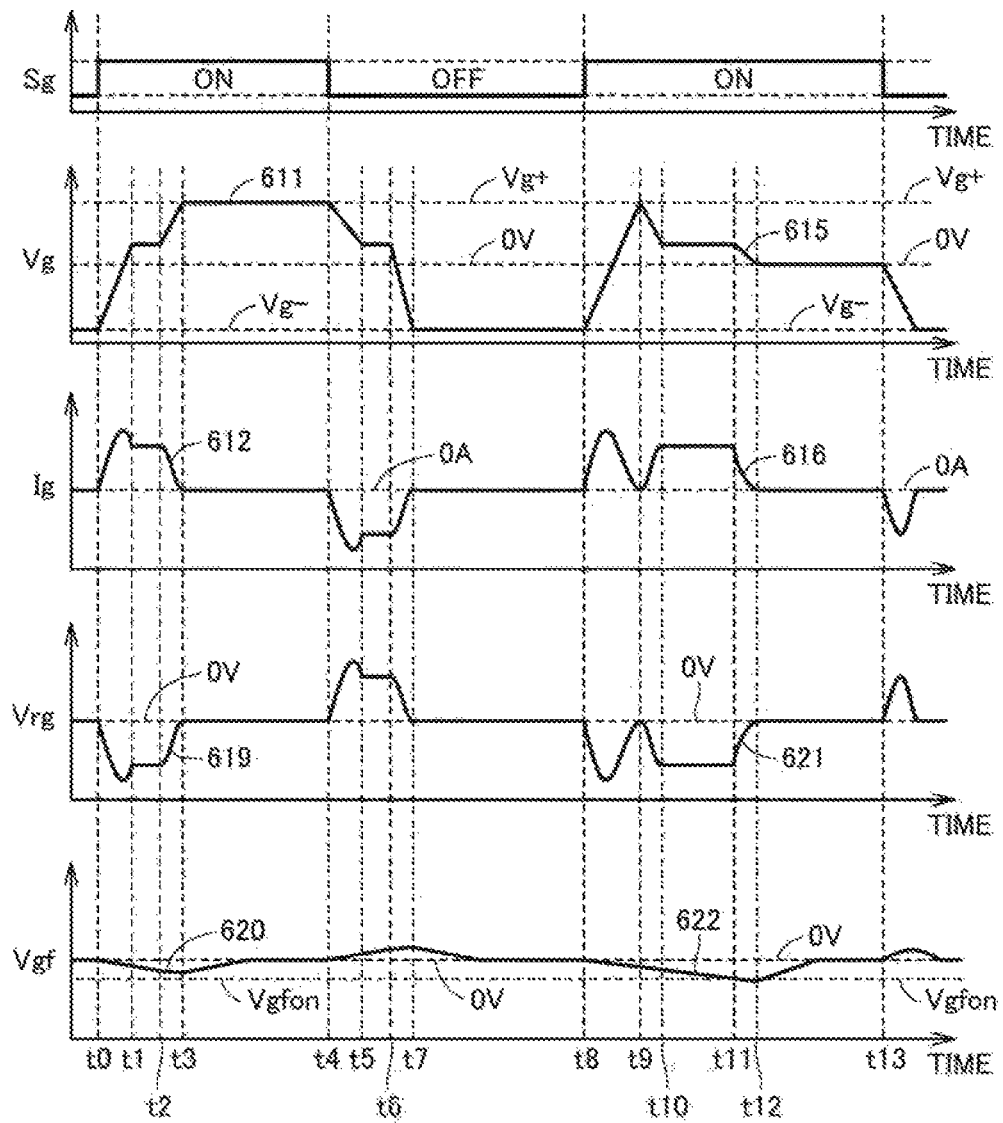
FIG. 9 is a timing diagram showing an example of the operation of the short-circuit protection circuit in the second embodiment.

FIG. 9 is a timing diagram showing an example of the operation of the short-circuit protection circuit in the second embodiment. In FIG. 9, a waveform of gate signal Sg which is output from gate signal output circuit 202, respective waveforms of gate voltage Vg and gate current Ig of self-arc-extinguishing type semiconductor element 302, and respective waveforms of voltages Vrg, Vgf in FIG. 7 are shown in this order from the top. With respect to one terminal of resistance element 115 on the gate voltage output circuit 204 side, voltage Vrg represents the potential of the other terminal of resistance element 115. Voltage Vgf represents the potential of the control electrode (base) of semiconductor switching element 143 with respect to the first main electrode (emitter) thereof (also referred to as gate voltage Vgf of semiconductor switching element 143).

Waveforms 611, 612, 619, 620 shown from time t0 to time t7 are those in the normal operation, and waveforms 615, 616, 621, 622 shown from time t8 are those in the short-circuit operation. The waveform of gate signal Sg, waveforms 611, 615 of gate voltage Vg, and waveforms 612, 616 of gate current Ig are identical to those in FIG. 4. In the following, the description of the components common to those in FIG. 4 will not be repeated.

1. In Normal Operation

In the following, with reference to FIGS. 2, 7, and 9, an operation of the short-circuit protection circuit in the normal operation will be described first.

In the turn-on operation from time t0 to time t3, semiconductor switching element 241 is in the ON state, and therefore, gate current Ig flows from power supply node 511 (positive power supply potential Vg+) in the direction toward control electrode 801 of self-arc-extinguishing type semiconductor element 302. Accordingly, negative voltage Vrg is generated at resistance element 115 which is a component of gate current detection circuit 107.

Since RC filter circuit 170 is provided between resistance element 115 and semiconductor switching element 143 in FIG. 9, gate electrode Vgf of semiconductor switching element 143 changes with a delay relative to change voltage Vrg generated at resistance element 115. Accordingly, the time constant which is determined by the resistance value of resistance element 116 and the capacitance value of capacitor 132 can be adjusted to present the absolute value of voltage Vgf from exceeding the absolute value of threshold voltage Vgfon of semiconductor switching element 143 in the turn-on period (namely prevent voltage Vgf from becoming smaller than threshold voltage Vgfon when the minus sign is taken into consideration).

In the turn-off operation from time t4 to time t7, semiconductor switching element 242 is in the ON state, and therefore, gate current Ig flows from control electrode 801 of self-arc-extinguishing type semiconductor element 302 in the direction toward power supply node 503 (negative power supply potential Vg−). Therefore, positive voltage Vrg generated at resistance element 115 which is a component of gate current detection circuit 107. In this case, the polarity of gate voltage Vgf of semiconductor switching element 143 is opposite to that in the turn-on operation. Therefore, voltage Vgf will not become smaller than threshold voltage Vfgon of semiconductor switching element 143 when the minus sign is taken into consideration.

2. In Short-Circuit Operation

Next, the operation of the short-circuit protection circuit in the short-circuit operation will be described. As described above in connection with FIG. 4, turn-on is started at time t8 and RTC circuit 304 is driven into the operating state at time t9. Accordingly, gate current Ig still keeps flowing after time t9 and therefore voltage Vrg is kept generated at resistance element 115. This voltage Vrg is applied to RC filter circuit 170 and thus charging of capacitor 132 is continued.

Because of the above, the absolute value of the voltage across capacitor 132 (namely gate voltage Vgf of semiconductor switching element 143) exceeds the absolute value of threshold voltage Vfgon of semiconductor switching element 143 at time t11. Then, semiconductor switching element 143 is turned on, and therefore, the gate block command signal is output from gate block command output circuit 102 and the gate block command signal is held in latch circuit 103.

Based on the gate block command signal held in latch circuit 103, gate block circuit 104 blocks the ON signal. Therefore, in the period from time t11 to time t12, gate voltage Vg becomes equal to 0 V (reference potential Vs) and gate current Ig becomes 0 A. Further, based on the gate block command signal held in latch circuit 103, Fo signal output circuit 105 outputs the Fo signal (fault detection signal) to control circuit 200 through isolator circuit 106.

At time t13, control circuit 200 causes the output of gate signal output circuit 202 to be switched from the ON signal to the OFF signal, based on the Fo signal (fault detection signal). In response to this, the output of gate voltage output circuit 204 is switched to negative power supply potential Vg−. Accordingly, gate voltage Vg of self-arc-extinguishing type semiconductor element 302 is decreased to negative power supply potential Vg−.

[Effects of Second Embodiment]

As seen from the above, the second embodiment illustrates an example of the specific configuration of the gate driver side protection circuit which is a component of the short-circuit protection circuit for the self-arc-extinguishing type semiconductor element. In particular the second embodiment is characterized by the fact that the gate current is detected based on the voltage across the gate resistor which is provided in the conventional gate driver. Accordingly, a complicated circuit configuration of the gate current detection circuit is unnecessary and thus the circuitry of the gate driver can be configured at a low cost. It should be noted that this effect is derived from the circuitry specifically shown in FIG. 7, and the latch circuit, the Fo signal output circuit, and the gate block circuit are not limited to the circuit configuration shown in FIG. 8. Other effects of the second embodiment are similar to those of the first embodiment.

Third Embodiment

[Configuration of Gate Block Command Output Circuit]

Figure 10:
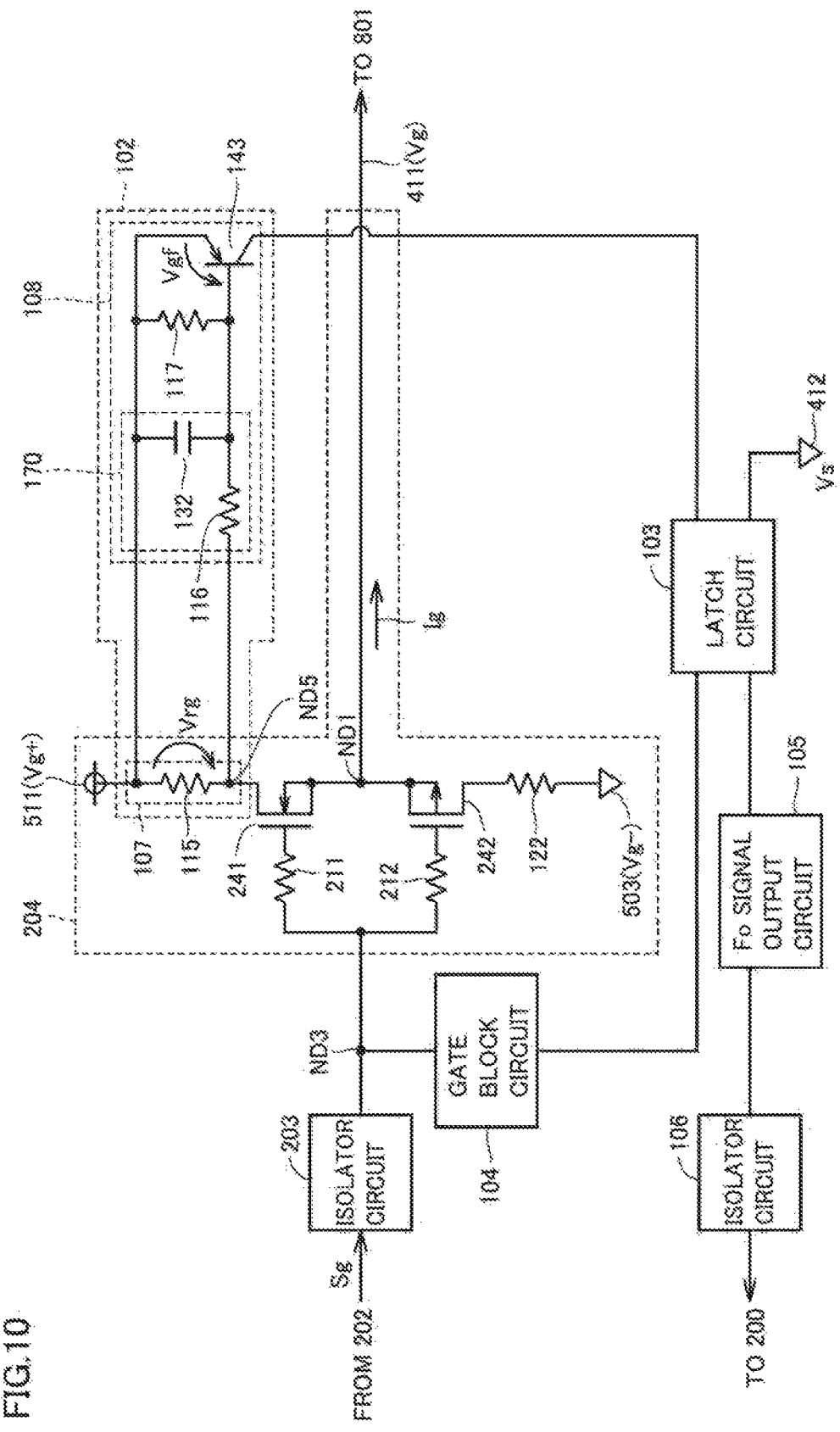
FIG. 10 is a circuit diagram showing a specific configuration of a gate block command output circuit used for a short-circuit protection circuit in a third embodiment.

FIG. 10 is a circuit diagram showing a specific configuration of gate block command output circuit 102 used for a short-circuit protection circuit in a third embodiment. FIG. 10 also shows a configuration of gate voltage output circuit 204.

It should be noted that gate voltage output circuit 204 in FIG. 10 differs from that in FIG. 7 in terms of the arrangement of the gate resistor of the self-arc-extinguishing type semiconductor element. In the case of FIG. 10, a gate resistor (resistance element 115) for turn-on and a gate resistor (resistance element 122) for turn-off are provided separately. Gate current detection circuit 107 is configured with only gate resistor 115 for turn-on. Accordingly, the gate current which flows in the turn-off operation is not detected and is therefore ignorable, which eliminates the need to consider malfunction of gate block command output circuit 102 in the turn-off operation.

Specifically, referring to FIG. 10, gate voltage output circuit 204 is a so-called push-pull circuit and includes an N-type semiconductor switching element 241, a P-type semiconductor switching element 242, and resistance elements 211, 212, 115, 122.

Semiconductor switching element 241 is connected between power supply node 511 which supplies positive power supply potential Vg+ and gate interconnection 411. Semiconductor switching element 242 is connected between power supply node 503 which supplies negative power supply potential Vg− and gate interconnection 411. Resistance element 115 is arranged between power supply node 511 and gate interconnection 411 (node ND1). Resistance element 115 may be provided between power supply node 511 and semiconductor switching element 241 as shown in FIG. 10, or provided between semiconductor switching element 241 and gate interconnection 411 (node ND1) in contrast to FIG. 10. Likewise, resistance element 122 is arranged between power supply node 503 and gate interconnection 411 (node ND1). Resistance element 122 may be provided between power supply node 503 and semiconductor switching element 242 as shown in FIG. 10, or provided between semiconductor switching element 242 and gate interconnection 411 (node ND1) in contrast to FIG. 10.

In the case of FIG. 10, an N-channel MOSFET and a P-channel MOSFET are used respectively as semiconductor switching elements 241 and 242. The drain of N-channel MOSFET 241 is connected to power supply node 511 through resistance element 115, and the drain of P-channel MOSFET is connected to power supply node 503 through resistance element 122.

Resistance element 211 has one end connected to the control electrode (gate) of semiconductor switching element 241, and the other end connected to isolator circuit 203. Likewise, resistance element 212 has one end connected to the control electrode (gate) of semiconductor switching element 242, and the other end connected to isolator circuit 203.

Based on voltage Vrg across resistance element 115 (gate resistor for turn-on), RTC operation determination circuit 108 determines whether RTC circuit 304 in FIG. 2 is in the operating state or not. RTC operation determination circuit 108 in FIG. 10 has the same configuration as that in FIG. 7, except for the arrangement of gate resistor 115 to which RTC operation determination circuit 108 is connected. Namely, RTC operation determination circuit 108 includes RC filter circuit 170 as a delay circuit, resistance element 117, and semiconductor switching element 143. RC filter circuit 170 includes resistance element 116 and capacitor 132. Semiconductor switching element 143 may either be bipolar transistor or MOSFET, for example. In the case of FIG. 10, semiconductor switching element 143 is a PNP-type bipolar transistor, by way of example.

Resistance element 116 and capacitor 132 are connected in series in this order between power supply node 511 and a terminal ND5, on the semiconductor switching element 241 side, of resistance element 115, and also connected in parallel to resistance element 115. Semiconductor switching element 143 is connected between power supply node 511 (positive power supply potential Vg+) and latch circuit 103. The relation of connection between resistance element 117, semiconductor switching element 143 and RC filter circuit 170 is identical to that in FIG. 7, and therefore, the description thereof will not be repeated. The second main electrode (collector) of semiconductor switching element 143 is directly connected to latch circuit 103 without diode 152 in between, in contrast to FIG. 7.

[Operation of Short-Circuit Protection Circuit]

Figure 11:
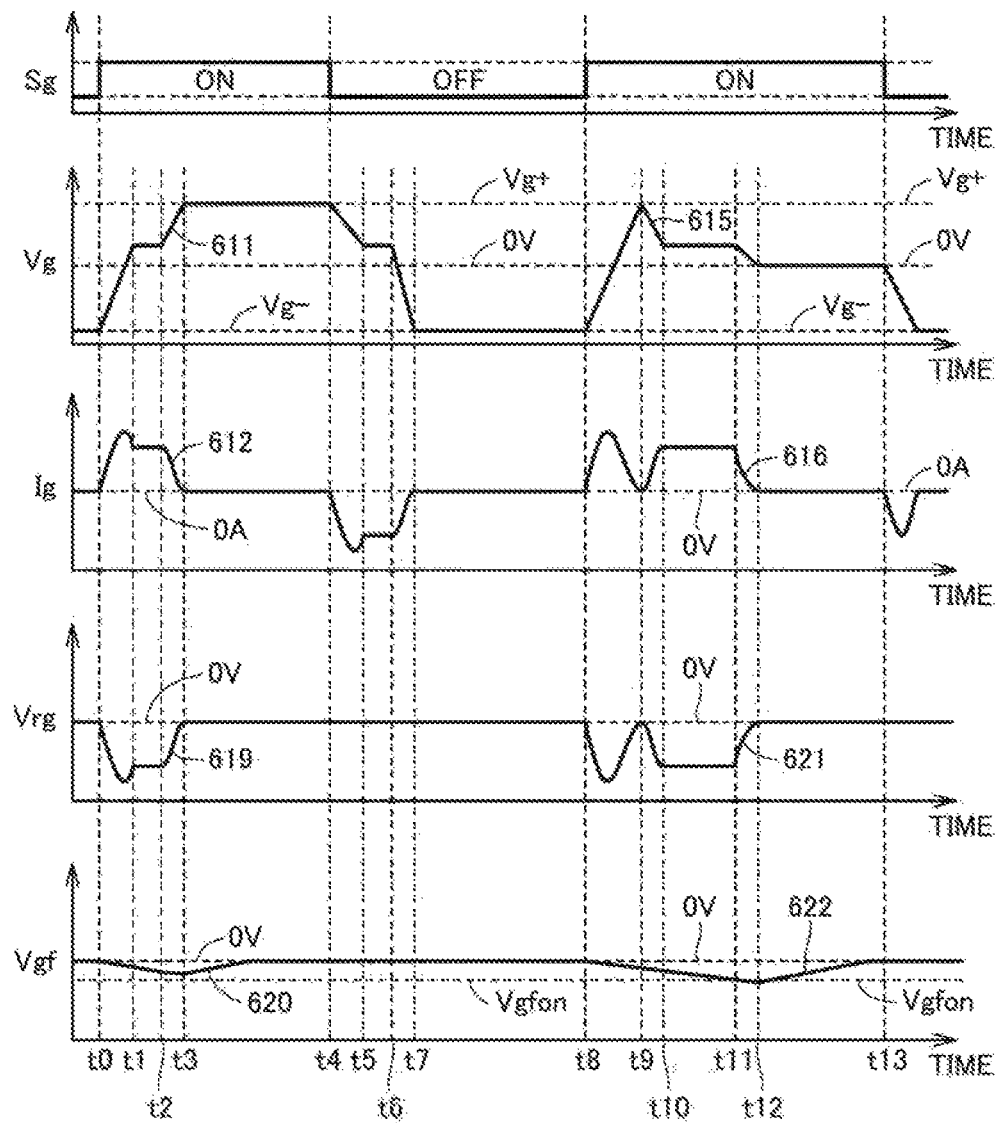
FIG. 11 is a timing diagram showing an example of the operation of the short-circuit protection circuit in the third embodiment.

FIG. 11 is a timing diagram showing an example of the operation of the short-circuit protection circuit in the third embodiment. The timing diagram in FIG. 11 corresponds to the timing diagram in FIG. 9. With respect to one terminal, on the power supply node 511 side, of resistance element 115, voltage Vrg represents the potential of the other terminal of resistance element 115.

In FIG. 11, the waveform of gate signal Sg which is output from gate signal output circuit 202 and respective waveforms of gate voltage Vg and gate current Ig of self-arc-extinguishing type semiconductor element 302 are identical to those in FIG. 7. As to respective waveforms of voltages Vrg, Vgf in FIG. 11, these waveforms in the turn-on operation (from time t0 to time t3 in the normal operation, from time t8 to time t12 in the short-circuit operation) are identical to those in FIG. 7; however, these waveforms in the turn-off operation (from time t4 to time t7 in the normal operation, after time t13 in the short-circuit operation) are different from those in FIG. 7. Namely, in the case of FIG. 11, the gate current does not flow in resistance element 115 in the turn-off operation, and therefore, both voltage Vrg and voltage Vgf remain 0 V and are not changed.

Thus, since voltages Vrg, Vgf in the turn-off operation are 0 V, filter capacitor 132 which is a component of RC filter circuit 170 is not forced to be discharged in the turn-off operation, unlike the second embodiment in which the polarity of voltage Vrg is reversed. The following effects are thus produced. Specifically, even when self-arc-extinguishing type semiconductor element 302 is turned on immediately after turned off, the difficulty in detecting that RTC circuit 304 is in the operating state due to delay in charging filter capacitor 132 is eliminated and it is unnecessary to take into consideration the operation in the turn-off operation.

As seen from the above, the short-circuit protection circuit for the self-arc-extinguishing type semiconductor element in the third embodiment eliminates the need to adapt to malfunction due to noise or the like in the turn-off operation, and facilitates optimization of circuit parameters for filter circuit 170. Therefore, the time constant of filter circuit 170 can be reduced and the time taken for the short-circuit protection can be shortened as compared with the second embodiment.

Fourth Embodiment

[Configuration of Gate Block Command Output Circuit]

Figure 12:
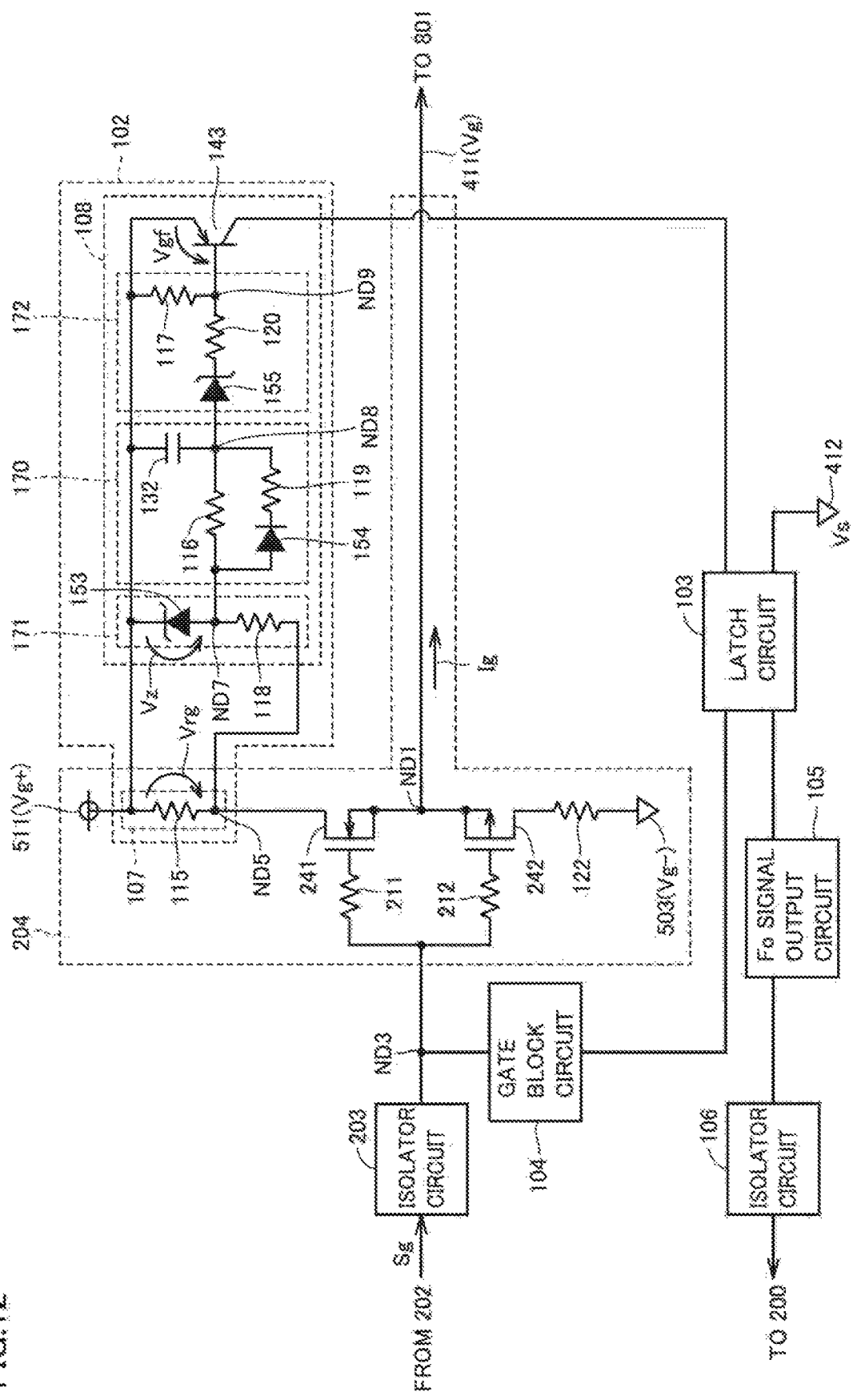
FIG. 12 is a circuit diagram showing a specific configuration of a gate block command output circuit used for a short-circuit protection circuit in a fourth embodiment.

FIG. 12 is a circuit diagram showing a specific configuration of gate block command output circuit 102 used for a short-circuit protection circuit in a fourth embodiment. FIG.

12 also shows the configuration of gate voltage output circuit 204 and this configuration is identical to that in FIG. 10.

Referring to FIG. 12, gate block command output circuit 102 includes a gate current detection circuit 107 and an RTC operation determination circuit 108. Gate current detection circuit 107 is configured with resistance element 115 (gate resistor), which is identical to FIG. 10; however, the configuration of RTC operation determination circuit 108 differs from that in FIG. 10.

Specifically, RTC operation determination circuit 108 in FIG. 12 includes an RC filter circuit 170, a semiconductor switching element 143, a voltage limitation circuit 171, and a voltage reduction circuit 172. It should be noted that semiconductor switching element 143 in FIG. 12 may either be bipolar transistor or MOSFET, for example, like that in FIG. 10. In the case of FIG. 12, semiconductor switching element 143 is a PNP-type bipolar transistor by way of example, and connected between power supply node 511 (positive power supply potential Vg+) and latch circuit 103.

Voltage limitation circuit 171 is a circuit provided between gate current detection circuit 107 and RC filter circuit 170 and limits a voltage which is to be input to RC filter circuit 170. Specifically, voltage limitation circuit 171 includes a resistance element 118 and a Zener diode 153. Resistance element 118 and Zener diode 153 are connected in series in this order between node ND5 (connection node of resistance element 115 and semiconductor switching element 241) and power supply node 511 (positive power supply potential Vg+), and also connected in parallel to resistance element 115. The cathode of Zener diode 153 is connected to power supply node 511.

RC filter circuit 170 includes resistance elements 116, 119, a capacitor 132, and a diode 154. Resistance element 116 and capacitor 132 are connected in series to each other and also connected in parallel to Zener diode 153. Resistance element 116 is connected to the anode (node ND7) side of Zener diode 153. Diode 154 and resistance element 119 are connected in series to each other and also connected in parallel to resistance element 116. The anode of diode 154 is connected to the anode (node ND7) side of Zener diode 153.

In the above-described configuration of RC filter circuit 170, during charging, capacitor 132 is being charged (current is flowing in the direction from power supply node 511 to node ND7) in accordance with the time constant which is determined by the resistance value of resistance element 116 and the capacitance value of capacitor 132. In contrast, during discharging, capacitor 132 is being discharged (current is flowing in the opposite direction to the direction when the capacitor is charged) in accordance with the time constant which is determined by the parallel combined resistance of resistance elements 116, 119 and the capacitance value of capacitor 132. Therefore, the time for discharging capacitor 132 can be made shorter than the time for charging capacitor 132.

Voltage reduction circuit 172 is a circuit provided between RC filter circuit 170 and semiconductor switching element 143 and reduces voltage Vgf which is to be applied between the control electrode (base) and the first main electrode (emitter) of semiconductor switching element 143. Specifically, voltage reduction circuit 172 includes resistance elements 117, 120 and a Zener diode 155. Resistance element 117 is connected in parallel between the control electrode (base) and the first main electrode (emitter) of semiconductor switching element 143. Zener diode 155 and resistance element 120 are connected in series in this order between a connection node ND8 of resistance element 116 and capacitor 132 and the control electrode (base) of semiconductor switching element 143. To connection node ND8, the anode of Zener diode 155 is connected.

[Operation of Short-Circuit Protection Circuit]

Figure 13:
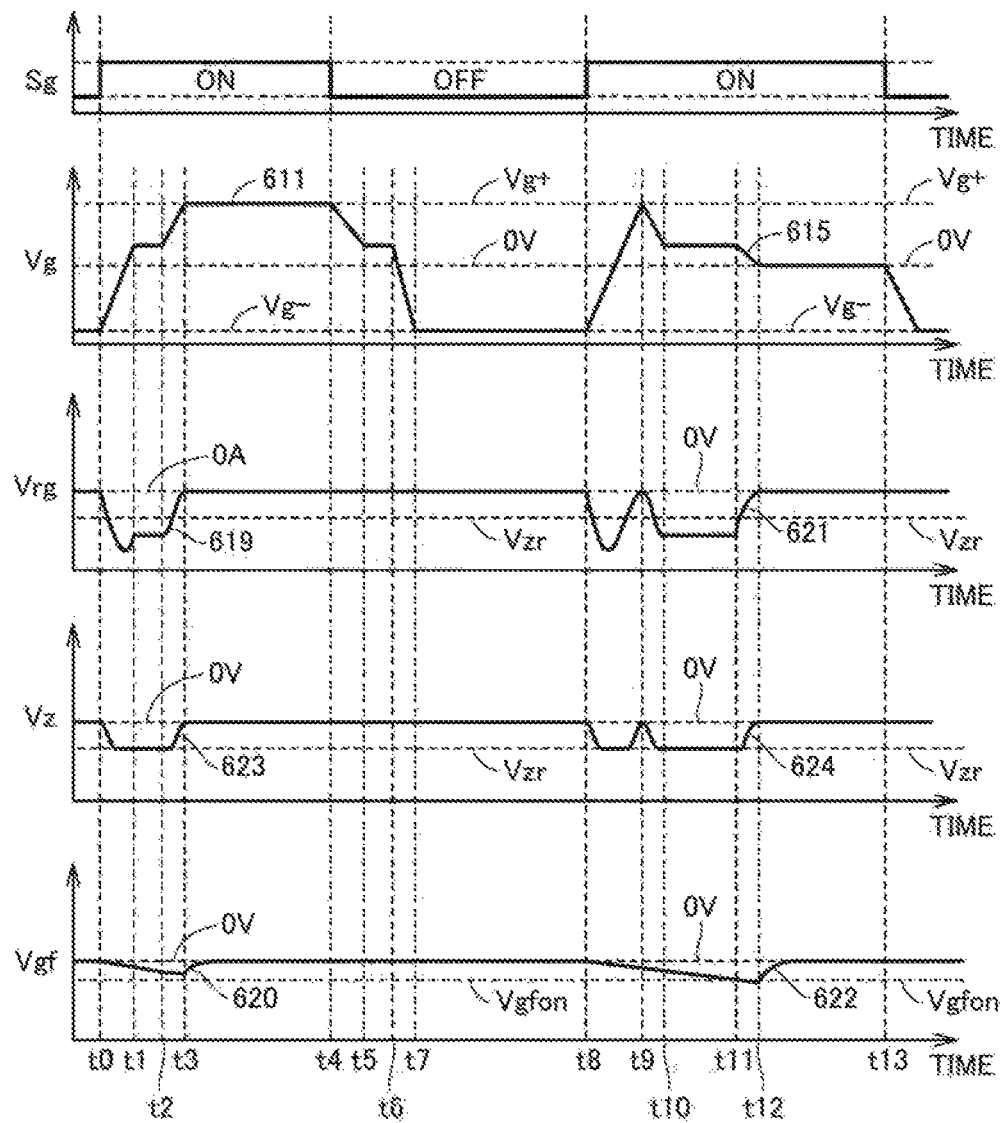
FIG. 13 is a timing diagram showing an example of the operation of the short-circuit protection circuit in the fourth embodiment.

FIG. 13 is a timing diagram showing an example of the operation of the short-circuit protection circuit in the fourth embodiment. In FIG. 13, gate signal Sg which is output from gate signal output circuit 202, gate voltage Vg of self-arc-extinguishing type semiconductor element 302, voltage Vrg generated at resistance element 115 in FIG. 12, voltage Vz generated at Zener diode 153, and gate voltage Vgf of semiconductor switching element 143 are shown in this order from the top. With respect to one terminal, on the power supply node 511 side, of resistance element 115, voltage Vrg represents the potential of the other terminal of resistance element 115. Voltage Vz represents the potential of the anode of Zener diode 153 with respect to the cathode thereof. Voltage Vgf represents the potential of the control electrode (base) of semiconductor switching element 143 with respect to the first main electrode (emitter) thereof.

Waveforms 611, 619, 623, 620 which are shown from time t0 to time t7 are those in the normal operation. Waveforms 615, 621, 624, 622 which are shown from time t8 are those in the short-circuit operation. The waveform of gate signal Sg, waveforms 611, 615 of gate voltage Vg of self-arc-extinguishing type semiconductor element 302, and waveforms 619, 621 of voltage Vrg are identical to those in FIG. 11.

It should be noted that voltage Vrg generated at resistance element 115 (gate resistor) in the turn-off operation (from time t4 to time t7 in the normal operation, from time t13 in the short-circuit operation) is zero in the fourth embodiment (FIG. 13), like the third embodiments (FIG. 11). There is thus a merit that the need to adapt to malfunction due to noise or the like in the turn-off operation is eliminated.

First, the operation and effects of voltage limitation circuit 171 will be described. Since voltage limitation circuit 171 is provided, the magnitude of the voltage which is input to RC filter circuit 170 (voltage Vz of Zener diode 153) in the turn-on operation (from time t0 to time t3, from time t8 to time t9) of self-arc-extinguishing type semiconductor element 302 or in the operation of RTC circuit 304 (from time t9 to time t11) is limited to Zener voltage Vzr. Accordingly, the magnitude of the voltage generated at capacitor 132 and the magnitude of the voltage applied to semiconductor switching element 143 are also limited. As a result of this, the time constant of RC filter circuit 170 can be decreased and therefore the short-circuit protecting operation can be speeded up, as compared with the case where voltage limitation circuit 171 is not provided.

Further, since voltage limitation circuit 171 is provided, there is a merit that the input voltage of RC filter circuit 170 can be made constant even when positive power supply voltage Vg+ applied to power supply node 511 varies. When positive power supply voltage Vg+ varies, the waveform of voltage Vrg generated at resistance element 115 is significantly changed, while the turn-on time (period from time t0 to time t3) remains substantially the same. It is therefore difficult to optimize parameters of RC filter circuit 170 unless voltage limitation circuit 171 is provided. In the case where voltage limitation circuit 171 is provided, the magnitude of the voltage which is input to RC filter circuit 170 is constant in the turn-on operation of self-arc-extinguishing type semiconductor element 302 or in the operation of RTC circuit 304. Accordingly, the parameters (therefore time constant) of RC filter circuit 170 can be optimized.

Next, the operation and effects of voltage reduction circuit 172 will be described. Threshold voltage Vgfon of semiconductor switching element 143 is on the order of 0.6 V to 1 V. Therefore, in the case of the second and third embodiments, it is necessary to set the time constant of RC filter circuit 170 to a relatively large value in order to prevent the absolute value of gate voltage Vgf of semiconductor switching element 143 from exceeding the absolute value of threshold voltage Vgfon thereof in the turn-on operation (from time t0 to time t3) in the normal operation.

In contrast, in the fourth embodiment in which voltage reduction circuit 172 is provided, gate voltage Vgf of semiconductor switching element 143 in the turn-on operation is equal to a voltage determined by subtracting the Zener voltage of Zener diode 155 from the voltage of capacitor 132 and dividing the result of this subtraction between resistance elements 117, 120. Namely, the absolute value of gate voltage Vgf of semiconductor switching element 143 is reduced relative to the case where voltage reduction circuit 172 is not provided. As a result of this, the time constant of RC filter circuit 170 can be set to a relatively small value, and the short-circuit protecting operation can be speeded up.

Next, effects of diode 154 and resistance element 119 which are newly added to RC filter circuit 170 in FIG. 12 will be described. As described above in connection with FIG. 12, addition of diode 154 and resistance element 119 enables the time for discharging capacitor 132 to be shorter than the time for charging capacitor 132. As a result of this, in the case of FIG. 13, the time taken for voltage Vgf to return to 0 V after time t3 is shorter as compared with the cases of the second and third embodiments shown in FIGS. 9 and 11, respectively. Likewise, the time taken for voltage Vgf to return to 0 V after time t12 is shorter as compared with the cases of FIGS. 9 and 11.

Generally, in the case of the inverter circuit described above in connection with FIG. 3, in order to prevent the ON signal from being input simultaneously so U-phase self-arc-extinguishing type semiconductor elements 302a, 302b, a dead time in which the OFF signal is input simultaneously to both U-phase self-arc-extinguishing type semiconductor elements 302a, 302b is provided at the time of switching between the ON signal and the OFF signal. The dead time is also provided for V-phase self-arc-extinguishing type semiconductor elements 302c, 302d and W-phase self-arc-extinguishing type semiconductor elements 302e, 302f. The dead time is preferably as short as possible because the dead time is a cause of waveform distortion of AC output.

However, in the case where diode 154 and resistance element 119 are not provided (in the case of the second and third embodiments), the time required for discharging capacitor 132 is almost equal to the turn-on time of self-arc-extinguishing type semiconductor element 302. In this case, the next ON signal cannot be input until discharging of capacitor 132 is completed and therefore the dead time is difficult to shorten. In contrast, in the case of the present embodiment, diode 154 and resistance element 119 can be provided to shorten the time for discharging capacitor 132 and therefore the dead time can be shortened.

The above-described configuration of voltage limitation circuit 171, voltage reduction circuit 172, and RC filter circuit 170 in FIG. 12 is applicable to not only the fourth embodiment but also RTC operation determination circuit 108 of the short-circuit protection circuit in the second and third embodiments.

Fifth Embodiment

[Configuration of Gate Block Command Output Circuit]

Figure 14:
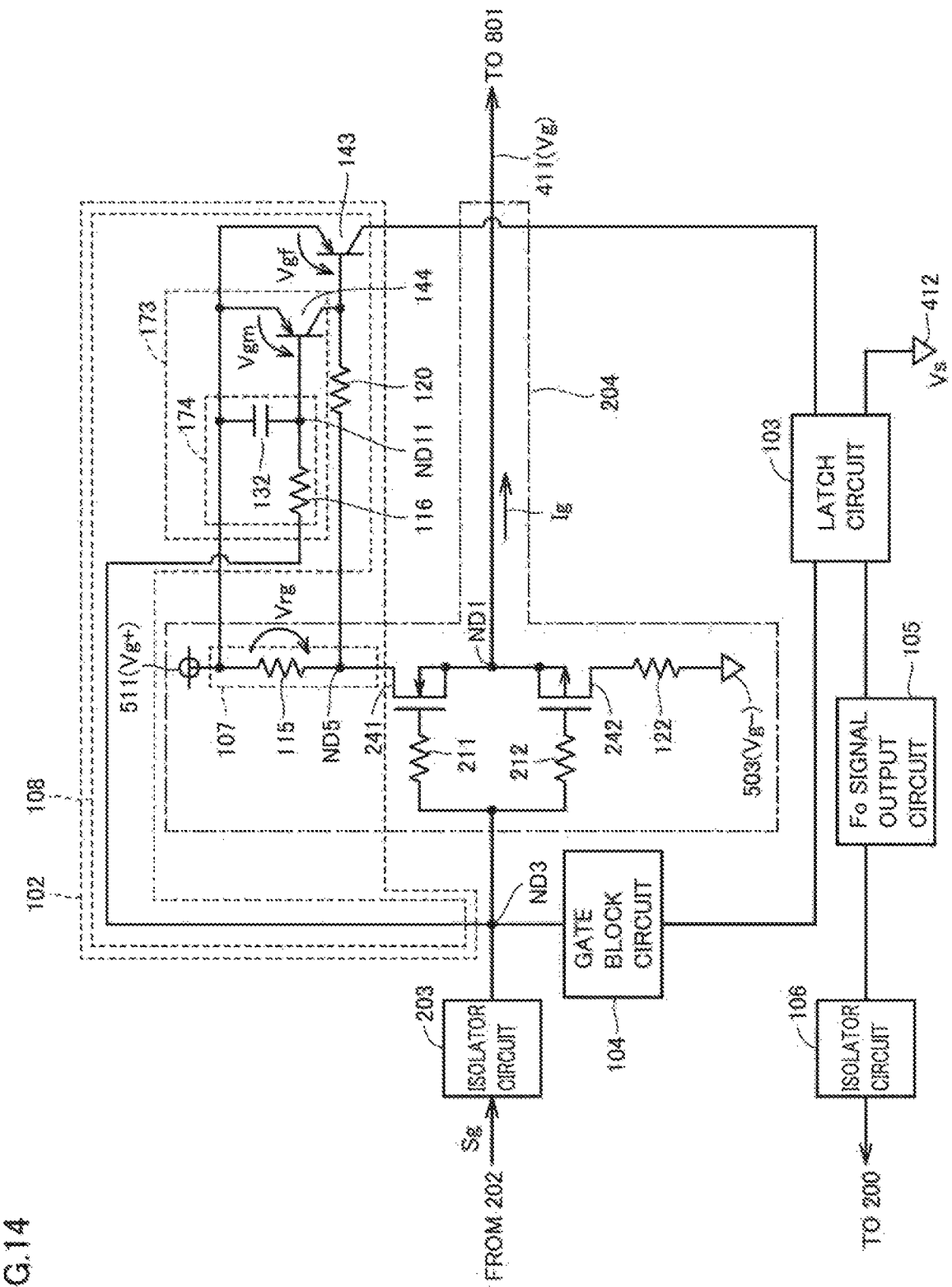
FIG. 14 is a circuit diagram showing a specific configuration of a gate block command output circuit used for a short-circuit protection circuit in a fifth embodiment.

FIG. 14 is a circuit diagram showing a specific configuration of a gate block command output circuit used for a short-circuit protection circuit in a fifth embodiment FIG. 14 also shows the configuration of gate voltage output circuit 204, and this configuration is identical to the configuration in FIGS. 10 and 12.

As shown in FIG. 14, gate block command output circuit 102 includes a gate current detection circuit 107 and an RTC operation determination circuit 108. The fact that gate current detection circuit 107 is configured with resistance element 115 (gate resistor) is identical to the third and fourth embodiments described above in connection with FIGS. 10 and 12 respectively. However, the configuration of RTC operation determination circuit 108 differs from that FIGS. 10 and 12 and also differs from that in the second embodiment described above in connection with FIG. 7.

Specifically, in the case of the second, third, and fourth embodiments, RTC operation determination circuit 108 is configured to include RC filter circuit 170. Voltage Vrg generated at resistance element 115 is input to RC filter circuit 170 and the output voltage of RC filter circuit 170 is applied between the control electrode and the first main electrode of semiconductor switching element 143 to thereby prevent the absolute value of gate voltage Vgf of semiconductor switching element 143 from exceeding the absolute value of the threshold voltage of semiconductor switching element 143 in the turned-on period.

In contrast, in the case of the fifth embodiment, gate voltage Vgf of semiconductor switching element 143 is kept at 0 V during a predetermined mask time from the time when the ON signal is output from gate signal output circuit 202. Namely, RTC operation determination circuit 108 is configured to determine, after a passage of a specified mask time, whether RTC circuit 304 is in the operating state or not. In this way, even when threshold voltage Vfgon of semiconductor switching element 143 varies, a malfunction that semiconductor switching element 143 is turned on in the normal operation can be prevented.

Referring to FIG. 14, RTC operation determination circuit 108 includes semiconductor switching element 143, a resistance element 120, and a mask circuit 173.

Semiconductor switching element 143 is connected between power supply node 511 (positive power supply potential Vg+) and latch circuit 103, like the third and fourth embodiments. When semiconductor switching element 143 is caused to become the ON state, semiconductor switching element 143 outputs to latch circuit 103 an H level voltage signal as a gate block command signal. Semiconductor switching element 143 may either be bipolar transistor or MOSFET, for example. In the example of FIG. 14, semiconductor switching element 143 is a PNP-type bipolar transistor by way of example. Semiconductor switching element 143 has its first main electrode (emitter) connected to power supply node 511, its second main electrode (collector) connected to latch circuit 103, and its control electrode (base) connected through resistance element 120 to a node ND 5 (terminal of resistance element 115 that is located opposite to power supply node 511).

Mask circuit 173 is connected between a node ND3 (a node on the output side of isolator circuit 203 and on the input side of gate voltage output circuit 204) and the control electrode of semiconductor switching element 143. Mask circuit 173 is configured to fix gate voltage Vgf of semiconductor switching element 143 at 0 V during a specified mask time from the time when the output of gate signal output circuit 202 is switched from the OFF signal to the ON signal, and to cause voltage Vrg across resistance element 115 (gate resistor) to be applied between the control electrode and the first main electrode of semiconductor switching element 143 after a passage of the mask time.

Specifically, mask circuit 173 includes a semiconductor switching element 144 and an RC filter circuit 174 as a delay circuit. Semiconductor switching element 144 may either be bipolar transistor or MOSFET, for example. In the case of FIG. 14, semiconductor switching element 144 is a PNP-type bipolar transistor, by way of example. The first main electrode (emitter) and the second main electrode (collector) of semiconductor switching element 144 are connected to the first main electrode (emitter) and the control electrode (base) of semiconductor switching element 143, respectively. The control electrode (base) of semiconductor switching element 144 is connected through RC filter circuit 174 to node ND3. In the following, voltage Vgm of the control electrode of semiconductor switching element 144 with respect to the first main electrode of semiconductor switching element 144 is referred to as gate voltage Vgm of semiconductor switching element 144.

RC filter circuit 174 includes a resistance element 116 and a capacitor 132. Resistance element 116 and capacitor 132 are connected in series in this order between node ND3 and power supply node 511. A connection node ND11 of resistance element 116 and capacitor 132 is connected to the control electrode (base) of semiconductor switching element 144.

[Operation of Short-Circuit Protection Circuit]

Figure 15:
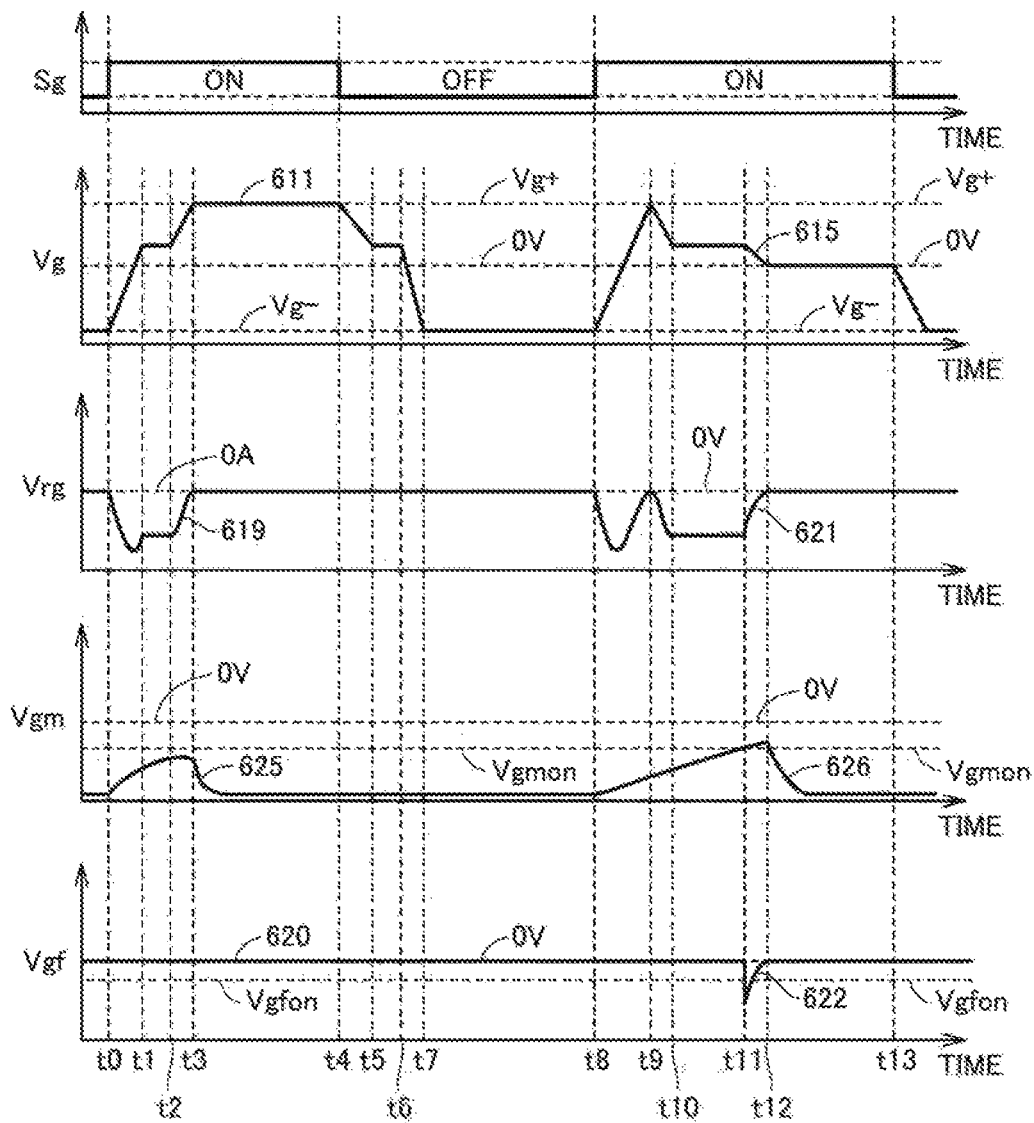
FIG. 15 is a timing diagram showing an example of the operation of the short-circuit protection circuit in the fifth embodiment.

FIG. 15 is a timing diagram showing an example of the operation of the short-circuit protection circuit in the fifth embodiment. In FIG. 15, gate signal Sg which is output from gate signal output circuit 202, gate voltage Vg of self-arc-extinguishing type semiconductor element 302, voltage Vrg generated at resistance element 115 in FIG. 14, gate voltage Vgm of semiconductor switching element 144, and gate voltage Vgf of semiconductor switching element 143 are shown in this order from the top. With respect to the terminal, on the power supply node 511 side, of resistance element 115, voltage Vrg represents the potential of the other terminal of resistance element 115. With respect to the first main electrode (emitter) of semiconductor switching element 144, voltage Vgm represents the potential of the control electrode (base) thereof. With respect to the first main electrode (emitter) of semiconductor switching element 143, voltage Vgf represents the potential of the control electrode (base) thereof.

Waveforms 611, 619, 625, 620 which are shown from time t0 to time t7 are those in the normal operation. Waveforms 615, 621, 626, 622 which are shown after time t8 are those in the short-circuit operation. The waveform of gate signal Sg, waveforms 611, 615 of gate voltage Vg of self-arc-extinguishing type semiconductor element 302, and waveforms 619, 621 of voltage Vrg are identical to those in FIGS. 11 and 13.

Referring to FIGS. 14 and 15, while the OFF signal is output from gate signal output circuit 202, semiconductor switching element 144 is in the ON state. Therefore, gate voltage Vgf of semiconductor switching element 143 is kept at 0 V.

A change of gate voltage Vgm of semiconductor switching element 144 when the output (gate signal Sg) of gate signal output circuit 202 is switched to the ON signal is delayed by RC filter circuit 174 relative to the change of gate signal Sg. When the absolute value of gate voltage Vgm of semiconductor switching element 144 becomes smaller than the absolute value of threshold voltage Vgmon, semiconductor switching element 144 is turned off and accordingly voltage Vrg of resistance element 115 is applied between the control electrode and the first main electrode of semiconductor switching element 143. It should be noted that the time constant of RC filter circuit 174 (the time constant is determined by the resistance value of resistance element 116 and the capacitance value of filter capacitor 132) is adjusted in order to prevent semiconductor switching element 144 from being turned off until completion of the turn-on operation of self-arc-extinguishing type semiconductor element 303 in the normal operation (namely until time t3), namely in order to prevent voltage Vgm from exceeding threshold voltage Vgmon when the minus sign is taken into consideration. Therefore, in the normal operation, gate voltage Vgf of semiconductor switching element 143 is kept at 0 V all the time.

In contrast, in the short-circuit operation, RTC circuit 304 is in the operating state after completion of the turn-on operation of self-arc-extinguishing type semiconductor element 302, namely after a passage of a delay time (mask time) generated by RC filter circuit 174. In this case, the absolute value of voltage Vgf immediately rises at time t11 which is the time when the delay time (mask time) has elapsed, to exceed the absolute value of threshold voltage Vfgon of semiconductor switching element 143. As a result of this, semiconductor switching element 143 becomes the ON state and an H level voltage as the gate block command signal is input to latch circuit 103.

As seen from the above, the short-circuit protection circuit in the fifth embodiment can perform the short-circuit protecting operation faster as compared with the second to fourth embodiments. It should be noted that RC filter circuit 170 may be provided in FIG. 14 between gate current detection circuit 107 (resistance element 115) and semiconductor switching element 143 for the purpose of removing noise.

It should be construed that each embodiment disclosed herein is given by way of illustration in all respects, not by way of limitation. It is intended that the scope of the present invention is defined by claims, not by the description above, and encompasses all modifications equivalent in meaning and scope to the claims.

REFERENCE SIGNS LIST

1 DC power supply; 2 load, 3U, 3V, 3W AC output circuit; 101 gate driver side protection circuit; 102 gate block command output circuit; 103 latch circuit; 104 gate block circuit; 105 Fo signal output circuit; 106, 203 isolator circuit; 107 gate current detection circuit; 108 operation determination circuit; 115 gate resistance element; 132 filter capacitor; 141, 142, 143, 144, 241, 242, 341 semiconductor switching element; 153, 155 Zener diode; 170, 174 RC filter circuit; 171 voltage limitation circuit; 172 voltage reduction circuit; 173 mask circuit; 200 control circuit; 201, 201a-201f gate driver; 202 gate signal output circuit; 204 gate voltage output circuit; 301, 301a-301f power module; 302, 302a-302f self-arc-extinguishing type semiconductor element; 304, 304a-304f RTC circuit; 305 short-circuit current detection circuit; 401 gate driver-to-power module interconnection; 411 gate interconnection (control interconnection); 412 reference potential interconnection; 503, 511 power supply node; 801 control electrode; 802 first main electrode; 803 second main electrode; 804 sense electrode

The invention claimed is:

1. A short-circuit protection circuit for a self-arc-extinguishing semiconductor element,
the self-arc-extinguishing semiconductor element including a first main electrode, a second main electrode, and a control electrode, and is configured to be switched on to be conductive between the first main electrode and the second main electrode or switched off to be non-conductive between the first main electrode and the second main electrode, in response to a drive voltage supplied between the control electrode and the first main electrode,
the short-circuit protection circuit comprising:
a first protection circuit configured to be in an operating state that reduces a voltage between the control electrode and the first main electrode when overcurrent flowing between the first main electrode and the second main electrode is detected; and
a second protection circuit including:
a gate current detection circuit configured to detect current flowing in an interconnection adapted to supply the drive voltage;
an operation determination circuit configured to determine, based on the detected current, whether the first protection circuit is in the operating state; and
a gate block circuit configured to change, when the first protection circuit is in the operating state, the drive voltage to turn off the self-arc-extinguishing semiconductor element.

2. The short-circuit protection circuit for a self-arc-extinguishing semiconductor element according to claim 1, wherein
the drive voltage is supplied from a drive circuit connected through a control interconnection to the control electrode of the self-arc-extinguishing semiconductor element,
the second protection circuit further includes a gate resistance element disposed on the control interconnection, and
the operation determination circuit is configured to determine whether the first protection circuit is in an operating state, based on a voltage generated at the gate resistance element.

3. The short-circuit protection circuit for a self-arc-extinguishing semiconductor element according to claim 2, wherein
the operation determination circuit includes:
a delay circuit configured to output a voltage which is changed with a delay relative to a change of the voltage generated at the gate resistance element; and
a determination circuit configured to determine that the first protection circuit is in an operating state, when the voltage which is output from the delay circuit exceeds a threshold voltage.

4. The short-circuit protection circuit for a self-arc-extinguishing semiconductor element according to claim 3, wherein
the operation determination circuit further includes a voltage limitation circuit provided between the gate resistance element and the delay circuit and configured to limit a magnitude of a voltage which is input from the gate resistance element to the delay circuit.

5. The short-circuit protection circuit for a self-arc-extinguishing semiconductor element according to claim 3, wherein
the delay circuit is configured as an RC filter circuit including a resistance element and a capacitor, and
the RC filter circuit is configured to have a smaller time constant when the capacitor is being discharged relative to a time constant when the capacitor is being charged.

6. The short-circuit protection circuit for a self-arc-extinguishing semiconductor element according to claim 3, wherein
the operation determination circuit further includes a voltage reduction circuit provided between the delay circuit and the determination circuit and configured to reduce a magnitude of a voltage which is input from the delay circuit to the determination circuit.

7. The short-circuit protection circuit for a self-arc-extinguishing semiconductor element according to claim 2, wherein
the drive circuit is configured to output the drive voltage for switching on the self-arc-extinguishing semiconductor element and output the drive voltage for switching off the self-arc-extinguishing semiconductor element, in response to an ON signal and an OFF signal, respectively, and
the operation determination circuit includes:
a determination circuit configured to determine that the first protection circuit is in an operating state, when the voltage generated at the gate resistance element exceeds a threshold voltage; and
a mask circuit provided between the gate resistance element and the determination circuit, and configured to mask the voltage generated at the gate resistance element for preventing the voltage from being input to the determination circuit during a predetermined mask period from a time when an input to the drive circuit is switched from the OFF signal to the ON signal to an end of the mask period.

8. The short-circuit protection circuit for a self-arc-extinguishing semiconductor element according to claim 1, wherein
the drive voltage is supplied from a drive circuit connected through a control interconnection to the control electrode of the self-arc-extinguishing semiconductor element,
the drive circuit includes:
a first semiconductor switching element connected between a first power supply node and the control interconnection; and
a second semiconductor switching element connected between a second power supply node and the control interconnection,
the drive circuit is configured to output the drive voltage for turning on the self-arc-extinguishing semiconductor element, when the first semiconductor switching element is in an ON state, and output the drive voltage for turning off the self-arc-extinguishing semiconductor element, when the second semiconductor switching element is in an ON state, and
the second protection circuit further includes a gate resistance element connected between the first power supply node and the control interconnection, and
the operation determination circuit is configured to determine whether the first protection circuit is in an operating state, based on a voltage generated at the gate resistance element.

9. The short-circuit protection circuit for a self-arc-extinguishing semiconductor element according to claim 8, wherein the operation determination circuit includes:
a delay circuit configured to output a voltage which is changed with a delay relative to a change of the voltage generated at the gate resistance element; and
a determination circuit configured to determine that the first protection circuit is in an operating state, when the voltage which is output from the delay circuit exceeds a threshold voltage.

10. The short-circuit protection circuit for a self-arc-extinguishing semiconductor element according to claim 9, wherein
the operation determination circuit further includes a voltage limitation circuit provided between the gate resistance element and the delay circuit and configured to limit a magnitude of a voltage which is input from the gate resistance element to the delay circuit.

11. The short-circuit protection circuit for a self-arc-extinguishing semiconductor element according to claim 9, wherein
the delay circuit is configured as an RC filter circuit including a resistance element and a capacitor, and
the RC filter circuit is configured to have a smaller time constant when the capacitor is being discharged relative to a time constant when the capacitor is being charged.

12. The short-circuit protection circuit for a self-arc-extinguishing semiconductor element according to claim 9, wherein
the operation determination circuit further includes a voltage reduction circuit provided between the delay circuit and the determination circuit and configured to reduce a magnitude of a voltage which is input from the delay circuit to the determination circuit.

13. The short-circuit protection circuit for a self-arc-extinguishing semiconductor element according to claim 8, wherein
the drive circuit is configured to output the drive voltage for switching on the self-arc-extinguishing semiconductor element and output the drive voltage for switching off the self-arc-extinguishing semiconductor element, in response to an ON signal and an OFF signal, respectively, and
the operation determination circuit includes:
a determination circuit configured to determine that the first protection circuit is in an operating state, when the voltage generated at the gate resistance element exceeds a threshold voltage; and
a mask circuit provided between the gate resistance element and the determination circuit, and configured to mask the voltage generated at the gate resistance element for preventing the voltage from being input to the determination circuit during a predetermined mask period from a time when an input to the drive circuit is switched from the OFF signal to the ON signal to an end of the mask period.

14. The short-circuit protection circuit for a self-arc-extinguishing semiconductor element according to claim 1, wherein
the self-arc-extinguishing semiconductor element is made from a semiconductor material for which silicon or silicon carbide is used.

15. The short-circuit protection circuit for a self-arc-extinguishing semiconductor element according to claim 1, wherein
in the operating state of the first protection circuit, the current flowing in the interconnection adapted to supply the drive voltage flows through the first protection circuit during a period other than the time when the self-arc-extinguishing semiconductor element is being switched on or off.

* * * * *